(12) United States Patent
Deng et al.

(10) Patent No.: US 9,559,879 B2
(45) Date of Patent: Jan. 31, 2017

(54) PA CELL, PA MODULE, WIRELESS COMMUNICATION UNIT, RF TRANSMITTER ARCHITECTURE AND METHOD THEREFOR

(71) Applicant: MediaTek Singapore Pte. Ltd., Singapore (SG)

(72) Inventors: Zhiming Deng, San Jose, CA (US); Chun-Hsien Peng, Nantou County (TW)

(73) Assignee: Mediatek Singapore Pte. Ltd., Solaris (SG)

( * ) Notice: Subject to any disclaimer, the term of this patent is extended or adjusted under 35 U.S.C. 154(b) by 0 days.

(21) Appl. No.: 14/280,672

(22) Filed: May 19, 2014

(65) Prior Publication Data

US 2014/0254720 A1    Sep. 11, 2014

Related U.S. Application Data

(63) Continuation-in-part of application No. 13/298,282, filed on Nov. 16, 2011.
(Continued)

(51) Int. Cl.
*H04L 25/03* (2006.01)
*H03F 3/24* (2006.01)
(Continued)

(52) U.S. Cl.
CPC ....... *H04L 25/03343* (2013.01); *H03F 1/3205* (2013.01); *H03F 1/3247* (2013.01);
(Continued)

(58) Field of Classification Search
CPC .. H04L 27/365; H04L 27/367; H04L 27/2092; H04L 25/03343; H03F 2200/336; H03F 1/3205; H03F 3/19; H03F 3/217; H03F 3/24; H03F 2201/3233

See application file for complete search history.

(56) References Cited

U.S. PATENT DOCUMENTS 5,105,445 A    4/1992  Karam
6,054,895 A    4/2000  Danielsons et al.
(Continued)

FOREIGN PATENT DOCUMENTS

CN    1784879 A    6/2006
CN    1819471 A    8/2006
(Continued)

OTHER PUBLICATIONS

Morteza S. Alavi, Akshay Visweswaran, Robert B. Staszewski, Leo C.N de Vreede, John R. Long, Atef Akhnoukh, "A 2-GHz Digital I/Q Modulator in 65-nm CMOS", Delft University of Technology, The Netherlands, IEEE Asian Solid-State Circuits Conference, Nov. 14-16, 2011.*
(Continued)

*Primary Examiner* — Aristocratis Fotakis
(74) *Attorney, Agent, or Firm* — Optimus Patents US, LLC

(57) ABSTRACT

A power amplifier cell includes a first input arranged to receive an in-phase control signal, a second input arranged to receive a quadrature control signal, an input stage arranged to output a drive signal based at least partly on the received in-phase and quadrature control signals, and an output stage arranged to receive at an input thereof the drive signal output by the input stage, and to generate an output signal for the power amplifier cell in response to the received drive signal.

16 Claims, 13 Drawing Sheets

Related U.S. Application Data

(60) Provisional application No. 61/825,628, filed on May 21, 2013, provisional application No. 61/477,684, filed on Apr. 21, 2011, provisional application No. 61/500,900, filed on Jun. 24, 2011.

(51) Int. Cl.
   *H03F 3/217* (2006.01)
   *H03F 1/32* (2006.01)
   *H03F 3/19* (2006.01)
   *H04B 1/04* (2006.01)
   *H04L 27/36* (2006.01)

(52) U.S. Cl.
   CPC .............. *H03F 3/19* (2013.01); *H03F 3/2175* (2013.01); *H03F 3/245* (2013.01); *H04B 1/0475* (2013.01); *H04L 25/0328* (2013.01); *H04L 27/367* (2013.01); *H03F 2200/451* (2013.01); *H03F 2201/3227* (2013.01); *H03F 2201/3233* (2013.01); *H03F 2203/21193* (2013.01); *H04B 2001/0425* (2013.01)

(56) References Cited

U.S. PATENT DOCUMENTS

| | | | |
|---|---|---|---|
| 6,298,097 | B1 | 10/2001 | Shalom |
| 6,697,436 | B1 | 2/2004 | Wright |
| 6,937,175 | B1 | 8/2005 | Cruz-Albrecht |
| 7,158,582 | B2 | 1/2007 | Gamm |
| 7,382,835 | B2 | 6/2008 | Anvari |
| 7,724,839 | B2 | 5/2010 | Chen |
| 7,826,549 | B1* | 11/2010 | Aggarwal ............. 375/270 |
| 7,826,553 | B2 | 11/2010 | Chen |
| 7,889,811 | B2 | 2/2011 | Byun |
| 2001/0050592 | A1 | 12/2001 | Wright |
| 2002/0085647 | A1 | 7/2002 | Oishi |
| 2003/0035494 | A1 | 2/2003 | Bauder |
| 2003/0179830 | A1 | 9/2003 | Eidson |
| 2004/0124916 | A1 | 7/2004 | Kontson |
| 2005/0195030 | A1 | 9/2005 | Okazaki |
| 2006/0119493 | A1 | 6/2006 | Tal |
| 2006/0291589 | A1* | 12/2006 | Eliezer et al. ............. 375/302 |
| 2007/0049219 | A1 | 3/2007 | Demir |
| 2007/0147541 | A1* | 6/2007 | Saito ............. H03F 1/0205 375/297 |
| 2007/0190952 | A1* | 8/2007 | Waheed et al. ............. 455/114.3 |
| 2008/0002788 | A1* | 1/2008 | Akhtar et al. ............. 375/298 |
| 2008/0075194 | A1 | 3/2008 | Ravi |
| 2008/0187035 | A1 | 8/2008 | Nakamura |
| 2009/0004981 | A1 | 1/2009 | Eliezer |
| 2009/0051426 | A1 | 2/2009 | Ba |
| 2009/0054016 | A1 | 2/2009 | Waheed |
| 2009/0225903 | A1 | 9/2009 | van Waasen |
| 2010/0073084 | A1 | 3/2010 | Hur |
| 2010/0074367 | A1 | 3/2010 | Kim |
| 2010/0090745 | A1* | 4/2010 | Kousai et al. ............. 327/355 |
| 2010/0105338 | A1 | 4/2010 | Wang |
| 2010/0109734 | A1* | 5/2010 | Rylov ............. H03H 11/20 327/256 |
| 2010/0127780 | A1 | 5/2010 | An |
| 2011/0058622 | A1 | 3/2011 | Liang |
| 2011/0080216 | A1 | 4/2011 | Mujica |
| 2011/0103508 | A1 | 5/2011 | Mu |
| 2011/0129037 | A1* | 6/2011 | Staszewski et al. ............. 375/316 |
| 2011/0176636 | A1 | 7/2011 | Wang |
| 2011/0260797 | A1* | 10/2011 | Lee ............. 330/295 |
| 2012/0081179 | A1* | 4/2012 | Visser ............. H03F 1/02 330/251 |
| 2012/0128092 | A1* | 5/2012 | Lai et al. ............. 375/295 |
| 2012/0269293 | A1* | 10/2012 | Peng ............. H04B 1/0475 375/297 |
| 2015/0180418 | A1* | 6/2015 | Maeda ............. H03F 3/193 375/297 |

FOREIGN PATENT DOCUMENTS

| | | |
|---|---|---|
| CN | 101036359 A | 9/2007 |
| CN | 101167324 A | 4/2008 |
| CN | 101478514 A | 7/2009 |
| JP | 200749621 A | 2/2007 |
| WO | 0025495 A1 | 5/2000 |
| WO | 0069065 A2 | 11/2000 |

OTHER PUBLICATIONS

Hsin-Hung Chen, Chih-Hung Lin, Po-Chiun Huang, and Jiunn-Tsair Chen, "Joint Polynomial and Look-Up-Table Predistortion Power Amplifier Linearization", National Tsing Hua University, Taiwan, IEEE, Aug. 2006.*

Morteza S. Alavi, Robert Bogdan Staszewski, Leo C. N. de Vreede, Akshay Visweswaran, and John R. Long, "All-Digital RF I/Q Modulator", Delft University of Technology, The Netherlands, IEEE, Nov. 2012.*

Chao Lu, Hua Wang, CH Peng, Ankush Goel, SangWon Son, Paul Liang, Ali Niknejad, HC Hwang and George Chien, "A 24.7dBm all-digital RF transmitter for multimode broadband applications in 40nm CMOS", MediaTek, University of Southern California, and University of California, IEEE, Feb. 2013.*

Ray Marston, "Understanding Digital Buffer, Gate, and Logic IC Circuits—Part 3:NAND Gate and OR Gate Circuits", Nuts and Volts, Jun. 2007.*

Jaimin Mehta et al., A 0.8mm2 All-Digital SAW-Less Polar Transmitter in 65nm EDGE SoC, ISSCC, p. 58-59, Figure 3.2.7, 2010.

Debopriyo Chowdhury et al., A 2.4GHz mixed-signal polar power amplifier with low-power integrated filtering in 65nm CMOS, 2010.

Calogero D. Presti et al., A 25 dBm digitally modulated CMOS power amplifier for WCDMA/EDGE/OFDM with adaptive digital predistortion and efficient power control, 2009.

Petri Eloranta et al., A multimode transmitter in 0.13 um CMOS using direct-digital RF modulator, IEEE Journal of Solid-State Circuits, vol. 42, No. 12, Dec. 2007.

Hyun H. Boo et al., Adaptive Predistortion Using a Delta-Sigma Modulator for Automatic Inversion of Power Amplifier Nonlinearity, 2009.

Mohammad. E. Heidari et al., All-digital out-phasing modulator for a software-defined transmitter, 2008.

Robert Bogdan Staszewski, All-Digital PLL and Transmitter for Mobile Phones, IEEE Journal of Solid-State Circuits, vol. 40, No. 12, Dec. 2005.

Edward Gebara et al., Integrated CMOS PA Technology for Cellular Digital Radios, Feb. 18, 2009.

Besbes, A Fast Adaptive Predistorter for Nonlinearly Amplified M-QAM Signals, pp. 108-112, 2000 IEEE.

Cavers, A Linearizing Predistorter With Fast Adaptation, pp. 41-47, 1990 IEEE.

"International Search Report" mailed on May 17, 2012 for International application No. PCT/CN2012/071661, International filing date:Feb. 27, 2012.

"International Search Report" mailed on Jul. 5, 2012 for International application No. PCT/CN2012/073413, International filing date:Mar. 31, 2012.

"International Search Report" mailed on Oct. 4, 2012 for International application No. PCT/CN2012/077358, International filing date:Jun. 21, 2012.

Pere Lluis Gilabert Pinal, Multi Look-Up Table Digital Predistortion for RF Power Amplifier Linearization, Dec. 2007, Chapter 5, PHD Thesis, Control Monitoring and Communications Group, Department of Signal Theory and Communications, Universitat Politecnica de Catalunya, Barcelona.

Cruise et al., "A Digital-to-RF-Amplitude Converter for GSM/GPRS/EDGE in 90-nm Digital CMOS", Jun. 2005, pp. 21-24, Radio Frequency integrated Circuits (RFIC) Symposium, IEEE.

Chen et al., "Joint polynomial and look-up-table power amplifier linearization scheme," Vehicular Technology Conference, 2003. VTC 2003—Spring. The 57th IEEE Semiannual, pp. 1345-1349 vol. 2, Apr. 22-25, 2003.

(56) References Cited

OTHER PUBLICATIONS

U.S. Appl. No. 13/351,209 mailed Oct. 22, 2015. pp. 1-12.

* cited by examiner

PA CELL, PA MODULE, WIRELESS COMMUNICATION UNIT, RF TRANSMITTER ARCHITECTURE AND METHOD THEREFOR

CROSS REFERENCE TO RELATED APPLICATIONS

This is a continuation-in-part (CIP) of co-pending U.S. application Ser. No. 13/298,282 (filed on Nov. 16, 2011), which claims the benefit of U.S. provisional application No. 61/477,684 (filed on Apr. 21, 2011) and U.S. provisional application No. 61/500,900 (filed on Jun. 24, 2011); and claims the benefit of U.S. provisional application No. 61/825,628 (filed on May 21, 2013). The entire contents of the related applications are incorporated herein by reference.

BACKGROUND

The field of this invention relates to a power amplifier cell, a power amplifier module, a wireless communication unit, a radio frequency transmitter architecture and a method of performing digital pre-distortion calibration within a radio frequency architecture.

Advances in the deep sub-micron CMOS (Complimentary Metal-Oxide Semiconductor) process have lead to digital circuits becoming smaller and more power efficient. However, it is known that analogue circuits do not scale particularly well with the deep sub-micron CMOS process. It is therefore desirable for devices, such as radio frequency (RF) transmitters, to remove as many analogue components or circuits as possible, for example with the assistance of digital signal processing algorithms, in order to be able to benefit from more use of deep sub-micron CMOS processes.

Furthermore, a large number of conventional RF transmitters use linear power amplifiers. Accordingly, the power efficiency of such conventional RF transmitters is usually very low, due to the low efficiency of the linear PAs used therein. Switch-mode PAs have very high efficiency in comparison, which make such switch-mode PAs an attractive alternative to conventional linear PAs within RF transmitters.

Thus, an RF transmitter that is able to utilize switch-mode PAs through the assistance of digital processing algorithms in order to reduce a PA's size and improve a PA's power efficiency is highly desirable. However, switch-mode PAs normally exhibit a highly non-linear input-output relationship. Furthermore, in order to meet stringent co-existence requirements of various wireless standards, noise shaping techniques are often required.

Digital polar transmitters are a type of known transmitter design that utilizes switch-mode PAs, whilst also taking advantage of CMOS process technology. Accordingly, such digital polar transmitters are able to achieve high power efficiency, whilst requiring only a small silicon area. However, a problem with these known transmitter designs is that, due to the inherent bandwidth expansion characteristics of the AM (amplitude modulation) and PM (phase modulation) signals in a polar architecture, they are only suitable for narrowband modulated signals.

Hybrid polar transmitter designs take advantage of two dimensional (in-phase/quadrature) modulation to enable wideband phase modulation to achieved. However, a problem with such hybrid polar transmitters is that they suffer from both amplitude and phase quantization noise, thus requiring significant noise shaping.

In-phase/Quadrature (IQ) RF digital-to-analogue converter (DAC) based transmitters are also known. I/Q RF DACs combine the functionalities of a DAC and a mixer, with the output of the I/Q RF DAC being combined in the analogue (RF) domain. However, such transmitter designs require a linear PA, and direct I/Q RF digital-to-analogue conversion is less power efficient than a digital polar transmitter design.

Another known (predominantly narrowband) RF transmitter design utilizes adaptive pre-distortion using a delta-sigma modulator for automatic inversion of power amplifier non-linearity. Such a design is relatively simple and allows for a use of low-precision DACs. However, this design still comprises a generally conventional architecture, and so PA efficiency is low.

It is anticipated that digitally-assisted/digitally-intensive RF transmitter architectures will become increasingly desirable. However, digital algorithms are limited by the availability of circuit speed; therefore finding simple and effective digital algorithms is crucial from an implementation perspective. In published literature currently available there are sometimes discussions on digital algorithms that operate at very high clock frequencies, such as four times the carrier frequency. However, such clock frequencies are, in a practical CMOS and/or subscriber communication unit sense, not implementable.

Thus, a need exists for an improved RF transmitter architecture, and method of operation therefor.

SUMMARY OF THE INVENTION

Accordingly, the invention seeks to mitigate, alleviate or eliminate one or more of the above mentioned disadvantages singly or in any combination.

According to a first aspect of the invention, there is provided a power amplifier cell comprising a first input arranged to receive an in-phase control signal; a second input arranged to receive a quadrature control signal, an input stage arranged to output a drive signal based at least partly on the received in-phase and quadrature control signals, and an output stage arranged to receive at an input thereof the drive signal output by the input stage, and to generate an output signal for the power amplifier cell in response to the received drive signal.

Thus, in this manner, such a power amplifier cell may be shared between in-phase and quadrature control signals, thereby enabling a single array power amplifier cells to be implemented in place of two separate in-phase and quadrature arrays of power cells required in a more conventional digital power amplifier topology. As a result, a significant reduction in the required silicon area to implement the power amplifier may be achieved.

According to one optional embodiment, the input stage may comprise:
  an in-phase sub-stage comprising an input arranged to receive an input signal representative of the in-phase control signal and an output operably coupled to the input of the output stage, the in-phase sub-stage being arranged to drive a current at its output in response to a logical state of the in-phase control signal; and
  a quadrature sub-stage comprising an input arranged to receive an input signal representative of the quadrature control signal and an output operably coupled to the input of the output stage, the quadrature sub-stage being arranged to drive a current at its output in response to a logical state of the quadrature control signal.

According to one optional embodiment, the output stage may be arranged to generate the output signal for the power amplifier cell in response to a combined current at its input.

According to one optional embodiment, the input stage may comprise at least one OR gate arranged to receive at a first input thereof the in-phase control signal and at a second input thereof the quadrature control signal, and the input stage is arranged to output a current signal in response to a logical state output by the OR gate.

According to one optional embodiment, the input stage and the output stage may comprise a cascode transistor topology.

According to one optional embodiment, the input stage may comprise a double cascode structure.

According to one optional embodiment, the input stage may be arranged to output a differential drive signal based at least partly on the in-phase and quadrature control signals, and the output stage may be arranged to receive at a differential input thereof the differential drive signal output by the input stage, and to generate a differential output signal for the power amplifier cell in response to the received differential drive signal.

According to one optional embodiment, the power amplifier cell may comprise a switched-mode power cell.

According to a second aspect of the invention, there is provided a power amplifier module comprising a plurality of power amplifier cells according to the first aspect of the invention.

According to one optional embodiment, the power amplifier module may be arranged to control the power amplifier cells by way of a complimentary control word collaboration scheme, whereby each bit within an in-phase control word is paired with a complementary bit within a quadrature control word.

According to a third aspect of the invention, there is provided a communication unit comprising a power amplifier module according to the second aspect of the invention.

According to a fourth aspect of the invention, there is provided a radio frequency transmitter architecture comprising at least one digital signal processing module configurable to operate in a transmission mode in which the at least one digital signal processing module is arranged to:
  receive a digital input signal;
  select, from a clipped set of digital power amplifier control values, a digital power amplifier control value based at least partly on the received digital input signal; and
  output to at least one power amplifier module according to Claim 9 the selected clipped digital power amplifier control value representative of the received digital input signal.

According to one optional embodiment, the clipped set of digital power amplifier control values may be clipped to avoid in-phase and quadrature overlap in accordance with a complimentary control word collaboration scheme.

According to one optional embodiment, the clipped set of digital power amplifier control values may be clipped by mapping prohibited codewords to at least one allowed codeword.

According to one optional embodiment, the at least one digital signal processing module may be configurable to operate in a training/calibration mode in which the at least one digital signal processing module is arranged to:
  receive a digital training signal;
  output to the at least one power amplifier module a digital power amplifier control value representative of the received digital training signal;
  receive a feedback signal from an output of the at least one digital power amplifier module; and
  perform calibration of the clipped set of digital power amplifier control values such that the digital power amplifier control values remain within clipped constraints to avoid in-phase and quadrature overlap in accordance with a complimentary control word collaboration scheme.

According to a fifth aspect of the invention, there is provided a method of performing digital pre-distortion calibration within a radio frequency architecture, the method comprising:
  receiving a digital training signal;
  outputting to at least one power amplifier module a digital power amplifier control value representative of the received digital training signal;
  receiving a feedback signal from an output of the at least one digital power amplifier module; and
  performing calibration of a clipped set of digital power amplifier control values such that the digital power amplifier control values remain within clipped constraints to avoid in-phase and quadrature overlap in accordance with a complimentary control word collaboration scheme.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to an example of a radio frequency (RF) transmitter architecture for use within, say, a wireless telecommunication handset and adapted in accordance with some embodiments of the present invention. However, it will be appreciated that the inventive concept described herein is not limited to specific features of the illustrated example, and may equally be implemented within alternative applications.

Figure 1:
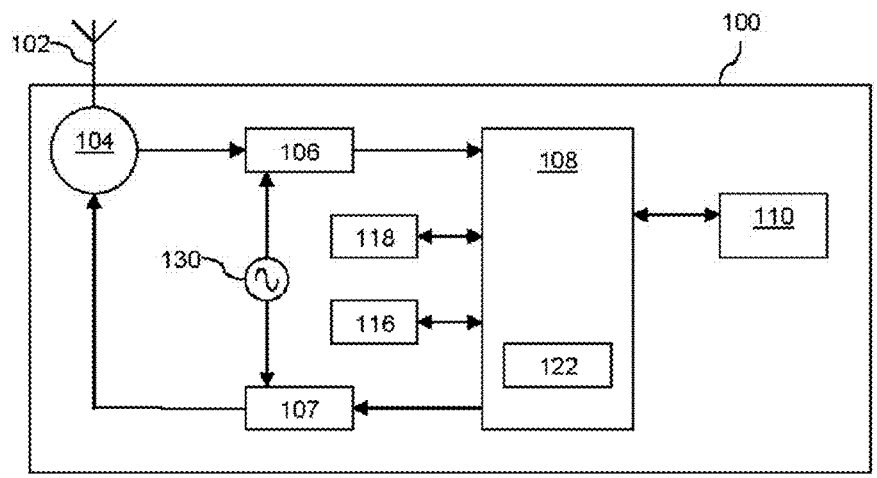
FIG. 1 illustrates an example of a simplified block diagram of part of an electronic device adapted to support the inventive concepts of an example of the present invention.

Referring first to FIG. 1, there is illustrated an example of a simplified block diagram of part of an electronic device 100 adapted to support the inventive concept of an example of the present invention. The electronic device 100, in the context of the illustrated embodiment of the invention, is a wireless telecommunication handset. As such, the electronic device 100 comprises an antenna 102 and contains a variety of well known radio frequency transceiver components or circuits operably coupled to the antenna 102. In particular for the illustrated example, the antenna 102 is operably coupled to a duplex filter or antenna switch 104 that provides isolation between a receiver chain 106 and a transmitter chain 107. As is known in the art, the receiver chain 106 typically includes radio frequency receiver circuitry for providing reception, filtering and intermediate or base-band frequency conversion. Conversely, the transmitter chain 107 typically includes radio frequency transmitter circuitry for providing modulation and power amplification.

For completeness, the electronic device 100 further comprises signal processing logic 108. An output from the signal processing logic 108 may be provided to a suitable user interface (UI) 110 comprising, for example, a display, keypad, microphone, speaker etc. The signal processing logic 108 may also be coupled to a memory element 116 that stores operating regimes, such as decoding/encoding functions and the like and may be realised in a variety of technologies, such as random access memory (RAM) (volatile), (non-volatile) read only memory (ROM), Flash memory or any combination of these or other memory technologies. A timer 118 is typically coupled to the signal processing logic 108 to control the timing of operations within the electronic device 100.

As is well known in the art, the transmitter chain 107 of such a wireless telecommunication handset comprises transmitter circuitry arranged to receive an input signal, for example from, in the illustrated example, the signal processing logic 108; the input signal comprising information to be transmitted over an RF interface. The transmitter chain 107 is further arranged to output an RF signal comprising the information to be transmitted to, in the illustrated example, the antenna 102 via the antenna switch 104. As such, the transmitter chain 107 is typically required to perform digital to analogue conversion, mixing, noise shaping and amplification of the input signal in order to generate the RF signal output thereby.

Figure 2:
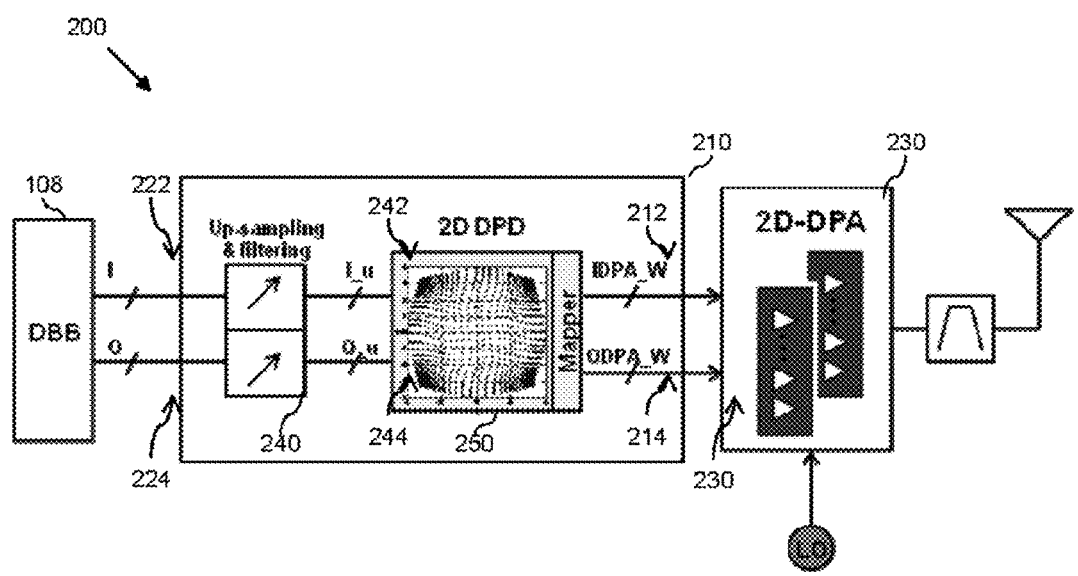
FIG. 2 illustrates a simplified example of a radio frequency transmitter architecture according to some examples of the present invention.

Referring now to FIG. 2, there is illustrated an example of an RF transmitter architecture 200 adapted in accordance with some example embodiments of the present invention, such as may be implemented within the transmitter chain 107 of FIG. 1. The RF transmitter architecture 200 of FIG. 2 comprises a digital signal processing module 210 arranged to receive one or more complex input signals comprising information to be transmitted over an RF interface, for example via antenna 102 of FIG. 1. In the illustrated example, the digital signal processing module 210 is arranged to receive from a digital baseband (DBB) component, such as the signal processing logic 108 of FIG. 1, an IQ (In-phase/Quadrature) input signal comprising a first (In-phase) signal component 222 and a second (Quadrature) signal component 224. The digital signal processing module 210 is further arranged to perform mapping of the received complex input signal (s) 222, 224 to a first, in-phase, digital control word 212 and a second, quadrature, digital control word 214, and to output the in-phase and quadrature digital control words to power amplifier module 230.

The power amplifier module 230 comprises at least one array of switch-mode power cells and, as described in greater detail below with reference to FIG. 5. The power amplifier module 230 is arranged to receive the digital control words output by the digital signal processing module 210, and to generate an analogue RF signal for transmission over an RF interface, for example via antenna 102, based at least partly on the received in-phase and quadrature digital control words.

In this manner, the RF transmitter architecture 200 comprises a complex signal based architecture, for example an IQ based architecture, and as such is suitable for both narrowband and wideband modulation input signals. This is in contrast to, for example, a digital polar architecture which is only suitable for narrowband modulated signals due to the inherent bandwidth expansion characteristics of the AM (amplitude modulation) and PM (phase modulation) input signals of a polar architecture. Furthermore, such an IQ based architecture avoids the need for implementing complex algorithms, such as the CORDIC algorithm typically required for digital polar architectures. In addition, the RF transmitter architecture 200 also extends the digital domain through to the power amplifier module 230, thereby benefiting from the scalability and efficiency of digital components to a greater extent than conventional RF architectures. Furthermore, the RF transmitter architecture 200 illustrated in FIG. 2 takes advantage of the efficiency of switch-mode power cells.

Switch-mode power cells typically exhibit a highly nonlinear input-output relationship, in particular when output power is high. Accordingly, the digital signal processing module 210 is arranged to perform two-dimensional non-uniform mapping of the input signals 222, 224 (as described in greater detail below) to the digital control words 212, 214. In this manner, the two-dimensional non-uniform mapping of the input signals 222, 224 provides pre-distortion of the input signals 222, 224, thereby enabling the non-linearity of the switch-mode power cells to be compensated for, also within the digital domain.

In some example embodiments of the present invention, digital pre-distortion is required to be performed with a sampling rate that is greater than that of the received complex input signal (for example in the region of three times that of the input signal) in order to preserve a certain spectrum at the output of the digital pre-distortion component 250. Accordingly, the digital signal processing module 210 of the RF transmitter architecture 200 of FIG. 2 comprises an up-sampling component 240 arranged to perform up-sampling of the received complex input signal 222, 224 to increase the sample rate thereof to, for example, an input data rate of the power amplifier module 230. In addition, for some example embodiments, the input to the power amplifier module 230 may comprise a 'sample and hold' operation. As such, so-called DAC images may be seen at the output of the power amplifier module 230 that are spaced from each other by the sampling frequency at the input of the power amplifier module 230. Accordingly, up-sampling of the input signal components 222, 224 may enable the spacing of such images to be increased.

The digital signal processing module 210 of the RF transmitter architecture 200 of FIG. 2 comprises a digital pre-distortion component 250 arranged to perform the non-uniform mapping of the (up-sampled) input signals 222, 224 to the digital control words 212, 214. The digital control words 212, 214 are output to one or more output ports 230 for coupling to one or more input ports of a power amplifier module 230.

Although the example of FIG. 2 is shown as comprising, say, a discrete integrated circuit comprising, at least, the signal processing module 210 that can be operably coupled to a distinct power amplifier module 230, it is envisaged in other examples that an integrated circuit may comprise the functionality of at least both the signal processing module 210 and the power amplifier module 230.

Figure 3:
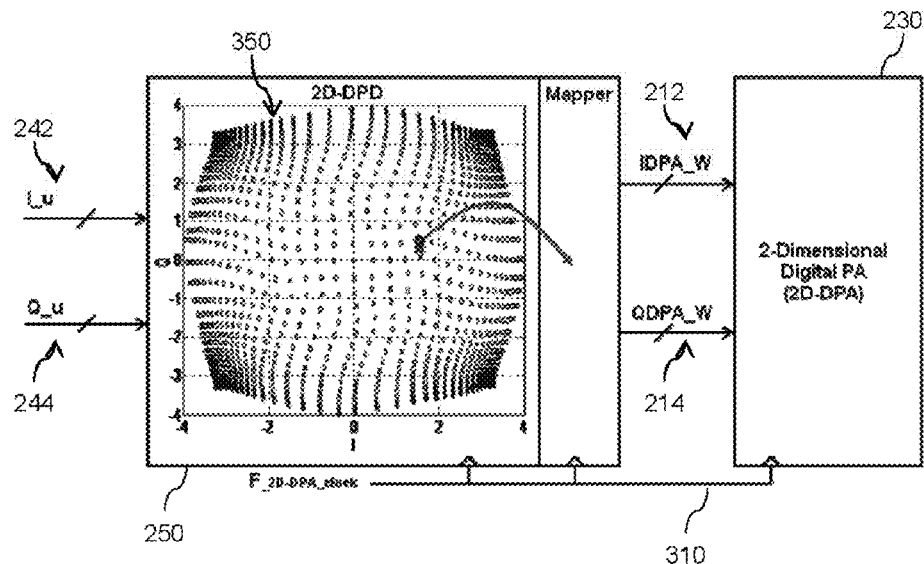
FIG. 3 illustrates a simplified example of a digital signal processing module of the radio frequency transmitter architecture of FIG. 2.

For example, and as illustrated more clearly in FIG. 3, the digital signal processing module 210 may comprise a digital pre-distortion component 250 arranged to receive the in-phase and quadrature components 222, 224 of the complex input signal, identify a closest matching predefined vector for the received complex input signal within a pre-distortion profile 350, and map the identified predefined vector to a set of digital control words to be output. Accordingly, the digital pre-distortion component 250 of the illustrated example is arranged to perform quantization and to simultaneously apply pre-distortion to the received in-phase and quadrature components 222, 224 of the complex input signal using the pre-distortion profile 350. In some examples of the present invention, the pre-distortion profile 350 may be at least partly based on an input/output relationship for the power amplifier module 230, and in particular the pre-distortion profile 350 may be at least partly based on an input/output relationship for the switch-mode power cell arrays of the power amplifier module 230. In this manner, pre-distortion may be applied to the (up-sampled) input signals 242, 244 that compensates for power amplifier module characteristics (and in particular the non-linear switch-mode power cell characteristics).

For the example illustrated in FIGS. 2 and 3, the digital pre-distortion component 250 is implemented within a feed-forward path (as opposed to a feedback path). In this manner, the digital pre-distortion component 250 is able to directly compensate for the non-linearity of the power amplifier module 230 for each input sample. Such sample-by-sample digital pre-distortion is more accurate and responsive than digital pre-distortion that is averaged across multiple input samples within a feedback path.

As also illustrated in FIG. 3, by up-sampling the received complex input signal 222, 224 to increase the sample rate thereof to an input data rate of the power amplifier module 230, the digital pre-distortion module component 250 and power amplifier module 230 may be provided with a common clock signal 310.

Thus, for the example illustrated in FIG. 3, the digital signal processing module 210 is arranged to receive the complex (IQ) input signal 222, 224, up-sample and non-uniformly map the received signal to digital control words 212, 214 such that pre-distortion is applied to compensate for the non-linear characteristics of the power amplifier module 230, and to output digital control words 212, 214 to the power amplifier module 230, wherein the digital control words 212, 214 are arranged to drive the power amplifier module 230 to output an analogue RF signal that represents the (up-sampled) complex (IQ) input signal 222, 224. In particular, a pre-distortion profile 350 used for mapping the up-sampled input signal components 222, 224 to the digital control words 212, 214 may be at least partly based on the input/output relationship for the switch-mode power cell arrays of the power amplifier module 230 to adaptively compensate for the non-linearities of the switch-mode power cell arrays. Thus, the digital signal processing module 210 of the illustrated example provides two dimensional (IQ) digital pre-distortion functionality within a feed-forward path of the RF transmitter architecture 200.

Figure 4:
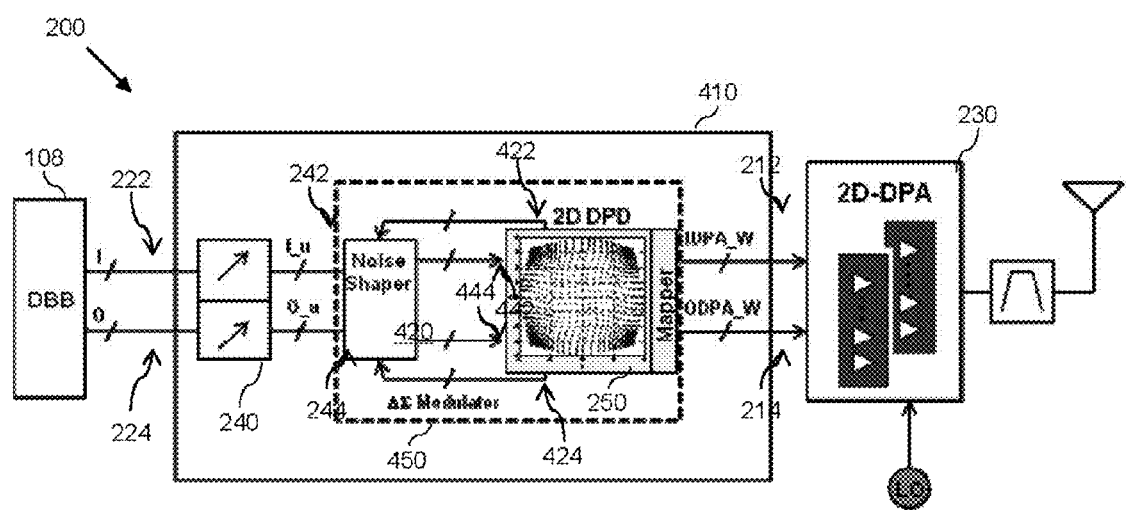
FIG. 4 illustrates a simplified alternative example of a radio frequency transmitter architecture according to some examples of the present invention.

Referring now to FIG. 4 there is illustrated the RF architecture 200 comprising an alternative example of a digital signal processing module 410 arranged to received from a digital baseband component, such as the signal processing logic 108 of FIG. 1, a complex (IQ) input signal 222, 224, perform mapping of the received complex input signal 222, 224 to digital control words 212, 214, and to output the digital control words 212, 214 to the power amplifier module 230. In particular for the illustrated example, the digital signal processing module 410 comprises an up-sampling component 240 arranged to perform up-sampling of the received complex input signal 222, 224 to increase the sample rate thereof to, for example, an input data rate of the power amplifier module 230. The digital processing module 410 further comprises a digital pre-distortion component 250 arranged to perform non-uniform mapping of the up-sampled input signals 222, 224 to the digital control words 212, 214.

The digital signal processing module 410 of FIG. 4 further comprises a noise shaping component 420. The noise shaping component 420 is arranged to receive the complex input signal, which for the illustrated example comprises the first (In-phase) and second (Quadrature) up-sampled signal components 242, 244, and one or more feedback signals 422, 424 from the digital pre-distortion component 250. The noise shaping component 420 is further arranged to apply noise shaping to the received complex input signal components 242, 244 based at least partly on the received feedback signals 422, 424, and to output to the digital pre-distortion component 250 the noise shaped input signal components 442, 444. In this manner, the digital pre-distortion component 250 is arranged to perform non-uniform mapping of the (up-sampled) noise shaped input signal components 442, 444 to the digital control words 212, 214.

In this manner, noise shaping of the complex input signal 222, 224 may be performed within the digital domain, and within the feed-forward path, prior to the non-uniform mapping to the digital control words 212, 214, enabling noise shaping to be maintained at the far-out region from the carrier, thus improving the spectrum at the desired far-out frequency band. In particular, it is contemplated that such noise shaping may be implemented through a configurable and/or programmable noise transfer function. In this manner, the RF transmitter architecture may be configured and/or programmed to perform required noise shaping to meet stringent co-existence requirements of a plurality of different wireless standards.

As illustrated in FIG. 4, the noise shaping component 420 and digital pre-distortion component 250 may be arranged to form a delta-sigma modulator, as illustrated at 450. In this manner, the delta-sigma modulator 450 is arranged to receive the complex (IQ) input signal 242, 244, up-sample and non-uniformly map the received signal to digital control words 212, 214 such that noise shaping and pre-distortion is applied to compensate for the non-linear characteristics of the power amplifier module 230, and to output digital control words 212, 214 to the power amplifier module 230, wherein the digital control words 212, 214 are arranged to drive the power amplifier module 230 to output an analogue RF signal that represents the (up-sampled) complex (IQ) input signal 242, 244. In particular, a pre-distortion profile 350 used for mapping the up-sampled and noise shaped input signal components 242, 244 to the digital control words 212, 214 may be at least partly based on the input/output relationship for the switch-mode power cell arrays of the power amplifier module 230 to adaptively compensate for the non-linearities of the switch-mode power cell arrays.

Advantageously, the implementation of quantization and two-dimensional digital pre-distortion within the delta-sigma modulator 450 in this manner may result in any quantization noise being relative to the pre-distortion profile, thereby enabling noise shaping to be achieved. In contrast, were two-dimensional digital pre-distortion implemented after the delta-sigma modulator, the noise shaping effect would be at least partly washed-out by the non-linearity of the power amplifier module 230, and thus such noise shaping would not be seen at the output of the power amplifier module 230. This is due to the digital pre-distortion only being able to mitigate non-linearity at frequencies close to the signal; whereas noise shaping is often required at frequencies far away from the signal band.

Figure 5:
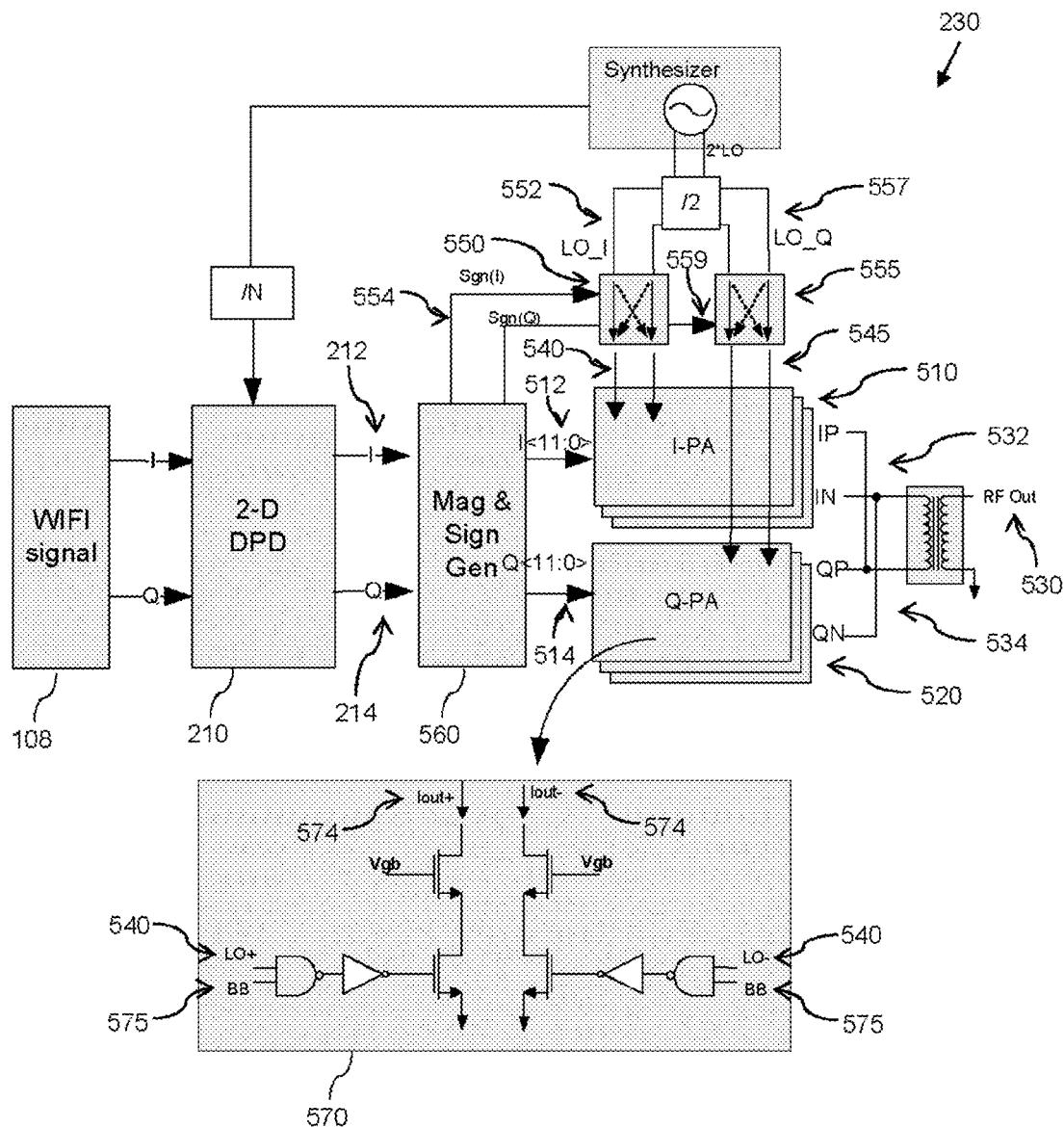
FIG. 5 illustrates a simplified block diagram of a power amplifier module of the radio frequency transmitter architecture of FIG. 2 and/or FIG. 4.

Referring now to FIG. 5, there is illustrated a simplified diagram of an example of the power amplifier module 230 of FIG. 2. The power amplifier module 230 is arranged to receive the digital control words 212, 214 output by the digital signal processing module 210, and to output an analogue RF signal 530 for transmission over an RF interface, for example via the antenna 102 of FIG. 1, based at least partly on the received digital control word 212, 214. In the example illustrated in FIG. 5, the power amplifier module 230 comprises a first array of switch-mode power cells 510 and a second array of switch-mode power cells 520. The first array of switch-mode power cells 510 is arranged to receive at least a part of the first (e.g. in-phase) digital control word 212 and to generate a first (e.g. in-phase) component 532 of the analogue RF signal 530 based at least partly on the received digital control word 212. Conversely, the second array of switch-mode power cells 520 is arranged to receive at least a part of the second (e.g. quadrature) digital control word 214 and to generate a second (e.g. quadrature) component 534 of the analogue RF signal 530 based at least partly on the received digital control word 214. The separate components 532, 534 are subsequently combined to generate the complex analogue RF signal 530.

In this manner, by providing multiple switch-mode power cell arrays 510, 520 arranged to receive separately the digital control words 212, 214 for the respective components of a multi-dimensional, e.g. complex (IQ), signal, and to separately generate the amplified components 532, 534 therefor (which may then be subsequently combined), a power amplifier module 230 is achieved that is capable of being digitally controlled to generate a multi-dimensional (e.g. IQ) amplified signal.

For some example embodiments, each of the arrays of switch-mode power cells 510, 520 may be arranged to receive at least a part of the respective digital control word 212, 214 comprising, say, N control bits. Furthermore, each of the arrays of switch-mode power cells 510, 520 may comprise N switch-mode power cells; each of the switch-mode power cells being arranged to receive a respective control bit of the respective digital control word 212, 214. An example of such a switch-mode power cell is illustrated at 570, which for the illustrated example comprises a high efficiency inverse Class D structure. Each of the switch-mode power cells 570 is arranged to receive a respective control bit, illustrated at 575, and to selectively output a current signal ($I_{out}$) 574 based on the value of the received control bit 575. The outputs of the switch-mode power cells 570 within each array 510, 520 are operably coupled together such that the individual power cell output current signals ($I_{out}$) 574 are combined to provide the respective component 532, 534 of the analogue RF signal 530. The output current signal ($I_{out}$) 574 for the individual switch-mode power cells 570 within each array 510, 520 may be weighted in accordance with the significance of their respective control bits. In this manner, the combined output current signal of each array 510, 520 may be representative of the value of the digital control word received thereby.

Advantageously, the power amplifier module 230 illustrated in FIG. 5 enables digital to analogue conversion functionality to be combined with power amplifier functionality, thereby simplifying the RF transmitter design. Furthermore, the provision of separate switch-mode power cell arrays 510, 520 to support the separate I and Q components of the complex IQ input signal enables the power amplifier module 230 to be suitable for both narrowband and wideband modulation input signals.

The switch-mode power cell arrays 510, 520 of the power amplifier module 230 illustrated in FIG. 5 are further arranged to receive respective carrier frequency signals 540, 545, and to generate the respective components 532, 534 of the analogue RF signal 530 further based at least partly on the received carrier frequency signals 540, 545. For example, the respective carrier frequency signal 540, 545 may be provided to each individual switch-mode power cell, such as illustrated at 540 within the illustrated power cell 570. In this manner, the power amplifier module 230 illustrated in FIG. 5 enables mixing functionality to also be combined with the power amplifier functionality and digital to analogue conversion functionality.

For the illustrated example, the power amplifier module 230 comprises a first (in-phase) phase selector 550 arranged to receive a first carrier frequency signal 552 and an in-phase sign signal 554, and to output an in-phase carrier frequency signal 540 for the first (in-phase) switch-mode power cell array 510 comprising a polarity based at least partly on the received in-phase sign signal 554. The power amplifier module 230 further comprises, for the illustrated example, a second (quadrature) phase selector 555 arranged to receive a second carrier frequency signal 557 and a quadrature sign signal 559, and to output a quadrature carrier frequency signal 545 for the second (quadrature) switch-mode power cell array 520 comprising a polarity based at least partly on the received quadrature sign signal 559.

The power amplifier module 230 of the illustrated example further comprises a magnitude and sign generator module 560. The magnitude and sign generator module 560 is arranged to receive the digital control words 212, 214 output by the digital signal processing module 210, and from each of the digital control words 212, 214 generate a magnitude control word 512, 514, comprising a magnitude component of the respective digital control word 212, 214, and a sign signal 554, 559, comprising a sign component of the respective digital control word 212, 214. The magnitude control words 512, 514 are then provided to the respective switch-mode power cell arrays 510, 520, and the sign signals 554, 559 are provided to the respective phase selector 550, 555. In this manner, the sign and magnitude of the in-phase and quadrature signal components may be separated to facilitate the use of switch-mode power cells.

Advantageously, because the digital domain extends through to the power amplifier module 230, there is no need for a linear pre-driver amplifier or baseband filter. Furthermore, the use of digitally controlled power cells enables the power consumption of the power amplifier module 230 to be scalable to substantially instantaneous RF output power.

The output impedance of the power amplifier module 230 is a function of signal power level (i.e. compression). Accordingly, the effective load for each switch-mode power cell array 510, 520 will comprise a combination of the load present on the output signal 530 and the output impedance of the opposing switch-mode power cell array 510, 520. For example, the effective load for the first (in-phase) power cell array 510 will comprise a combination of the load present on the output signal 530 and the output impedance of the second (quadrature) power cell array 520. Thus, the effective load of the first (in-phase) switch-mode power cell array 510 is a function of the Q-channel power level, and the effective load of the second (quadrature) switch-mode power cell array 520 is a function of the I-channel power level. Accordingly, the non-linear characteristics of the power amplifier module 230 for the illustrated example are not solely a function of the complex signal power ($|I|^2+|Q|^2$), but are also dependant on the in-phase and quadrature digital control words provided to the power amplifier module 230. Thus, whilst AM-AM and/or AM-PM correction is typically sufficient for a convention power amplifier arrangement with short memory, two dimensional pre-distortion is required for compensating for the non-linear characteristics of such a digital power amplifier module 230, such as provided by the digital signal processing modules illustrated in FIGS. 2 and 4.

Figure 6:
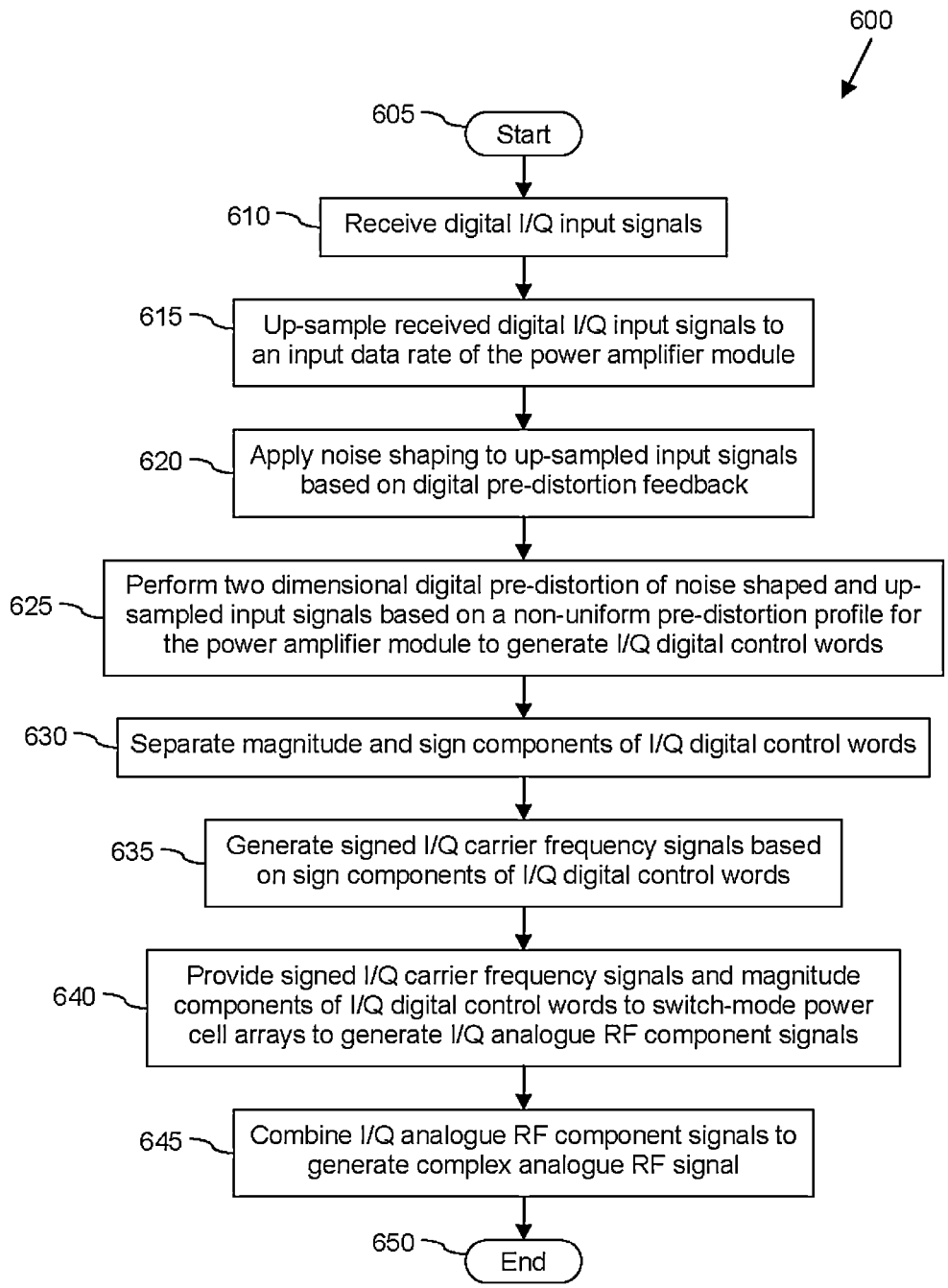
FIG. 6 illustrates a simplified flowchart of an example of a method for generating an analogue RF signal for transmission over an RF interface according to some embodiments of the present invention.

Referring now to FIG. 6, there is illustrated a simplified flowchart 600 of an example of a method for generating an analogue RF signal for transmission over an RF interface. The method of FIG. 6 starts at step 605, and moves on to step 610 with the receipt of digital in-phase and quadrature input signals comprising information to be transmitted over the RF interface. Next, at step 615, the received input signals are up-sampled to an input data rate of a power amplifier module. Noise shaping is then applied to the up-sampled input signals, at 620, based on feedback from a subsequent digital pre-distortion stage (at step 625). Two dimensional digital pre-distortion of the noise shaped, up-sampled input signals is then performed based on a non-uniform pre-distortion profile for the power amplifier module to generate in-phase and quadrature digital control words, at step 625. Next, at step 630, magnitude and sign components of the in-phase and quadrature control words are then separated, and signed in-phase and quadrature carrier frequency signals are then generated, at step 635, based (at least partly) on the respective sign components of the in-phase and quadrature control words. The magnitude components of the in-phase and quadrature control words and the signed in-phase and quadrature carrier frequency signals are then provided to respective in-phase and quadrature switch-mode power cell arrays, at step 640, to generate in-phase and quadrature analogue RF component signals. The in-phase and quadrature analogue RF component signals are then combined at step 645 to generate a complex analogue RF signal comprising the information to be transmitted over the RF interface, and the method ends at step 650.

For the example digital power amplifier topology illustrated in FIG. 5, each of the in-phase and quadrature switch-mode power cell arrays 510, 520 is required to be able to deliver the maximum required output power for the power amplifier module 230. However, when the power amplifier module 230 is at maximum required output power, only half of the power cells within the combined in-phase and quadrature arrays 510, 520 are in use at any one time. Specifically, even when the power amplifier module 230 is operating at maximum required output power, half of the power cells are not in use. This excess in the number of power cells required to implement an IQ power amplifier topology is an inefficient use of silicon area.

Figure 7:
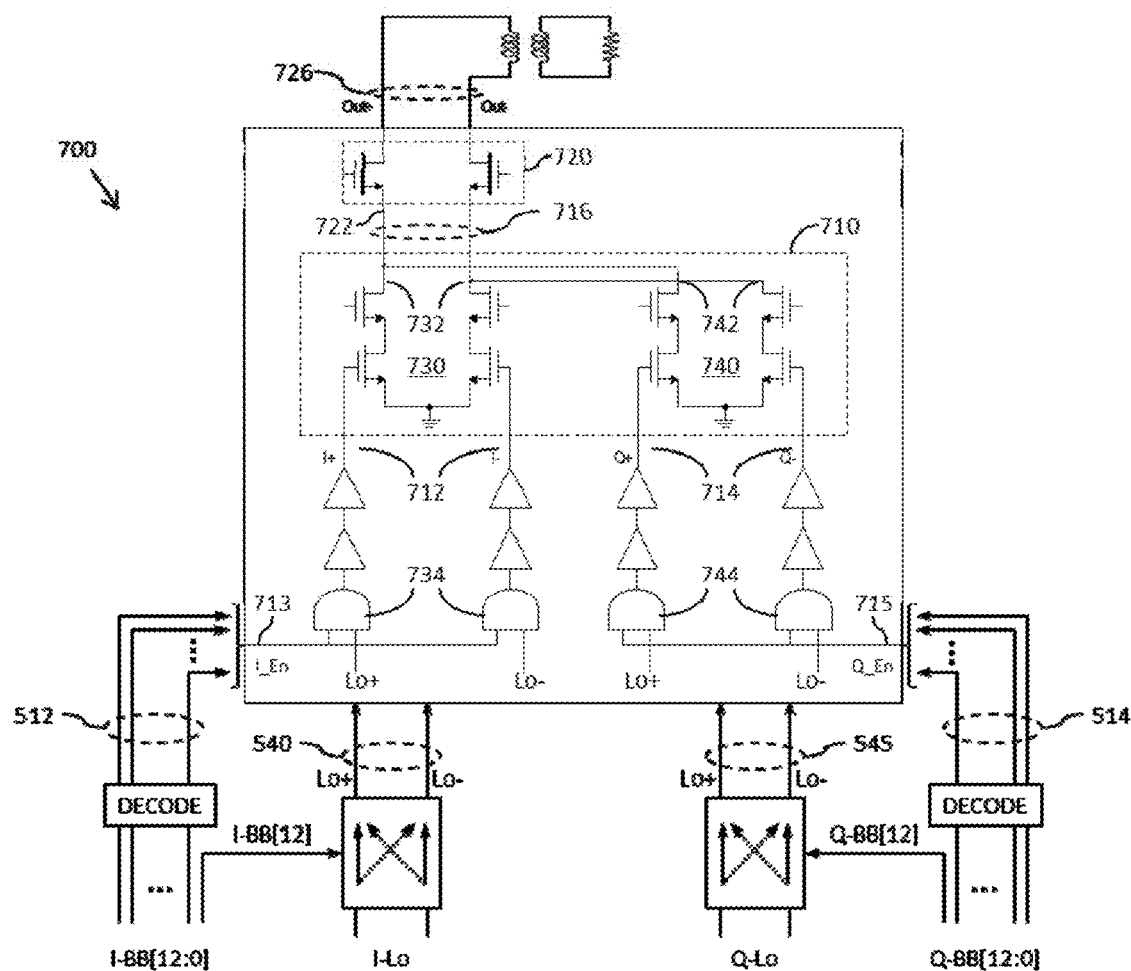
FIG. 7 illustrates a simplified circuit diagram of an example of a power amplifier cell.

FIG. 7 illustrates a simplified circuit diagram of an example of an alternative power amplifier cell 700, such as may be implemented within the power amplifier module 230 as an alternative to the power cell 570 illustrated in FIG. 5. The power amplifier cell 700 comprises an input stage 710. The input stage 710 comprises a first input 712 arranged to receive an in-phase control signal, for example representative of 1013 a respective control bit 713 within the in-phase magnitude control word 512 comprising a magnitude component of the in-phase digital control word 212. The input stage 710 further comprises a second input 714 arranged to receive a quadrature control signal, for example representative of a respective control bit 715 within the quadrature magnitude control word 514 comprising a magnitude component of the quadrature digital control word 214. The input stage 710 of the power amplifier cell 700 is arranged to output a drive signal 716 based on the received in-phase and quadrature control signals. The power amplifier cell 700 further comprises an output stage 720 arranged to receive at an input 722 thereof the drive signal 716 output by the input stage 710, and to generate an output signal 726 for the power amplifier cell 700 in response to the received drive signal 716.

In the example illustrated in FIG. 7, the input stage 710 of the power amplifier cell 700 comprises an in-phase sub-stage 730 comprising an input, which in the illustrated example forms the first input 712 of the input stage 710, arranged to receive an input signal representative of the respective bit 713 of the in-phase control word 512. The in-phase sub-stage 730 further comprises an output 732 operably coupled to the input 722 of the output stage 720. The in-phase sub-stage 730 is arranged to drive a current at its output 732 in response to the logical state of the respective bit 713 of the in-phase control word 512. For example, and as illustrated in FIG. 7, the power amplifier cell 700 may comprise a differential amplifier cell arranged to output a differential output signal 726. An in-phase input of the power amplifier cell 700 may comprise (for each differential signal path) an AND gate 734 arranged to receive the respective bit 713 of the in-phase control word 512 and respective differential components of the in-phase carrier frequency signal 540. In this manner, the output of each AND gate comprises a modulated representation of the logical state of the respective bit 713 of the in-phase control word 512. The in-phase sub-stage 730 comprises a common-source amplifier transistor structure arranged to receive the modulated control signal at gate input nodes thereof. In this manner, the modulated control signal is arranged to control the current flow through the common-source amplifier transistor structure, and thus control the current driven at the output of the in-phase sub-stage 730.

Similarly, the input stage 710 of the power amplifier cell 700 illustrated in FIG. 7 further comprises a quadrature sub-stage 740 comprising an input, which in the illustrated example forms the second input 714 of the input stage 710, arranged to receive an input signal representative of the respective bit 715 of the quadrature control word 514. The quadrature sub-stage 740 further comprises an output 742 operably coupled to the input 722 of the output stage 720. The in quadrature sub-stage 740 is arranged to drive a current at its output 742 in response to the logical state of the respective bit 715 of the quadrature control word 514. A quadrature input of the power amplifier cell 700 may also comprise (for each differential signal path) an AND gate 744 arranged to receive the respective bit 715 of the quadrature control word 514 and respective differential components of the quadrature carrier frequency signal 545. In this manner, the output of each AND gate comprises a modulated representation of the logical state of the respective bit 715 of the quadrature control word 514. The quadrature sub-stage 740 comprises a common-source amplifier transistor structure arranged to receive the modulated control signal at gate input nodes thereof. In this manner, the modulated control signal is arranged to control the current flow through the common-source amplifier transistor structure, and thus control the current driven at the output of the quadrature sub-stage 740.

The output stage 720 of the power amplifier cell 700 is arranged to generate the output signal 726 for the power amplifier cell 700 in response to a combined current at its input 722 from each of the in-phase and quadrature sub-stages 730, 740 of the input stage 710. In particular, in the illustrated example the input stage 710 and the output stage 720 together comprise a cascode transistor topology, and more specifically in the illustrated example a double cascode structure. Such a double cascode structure provides the advantage over a single cascode structure of being more reliable under high power operation.

Figure 8:
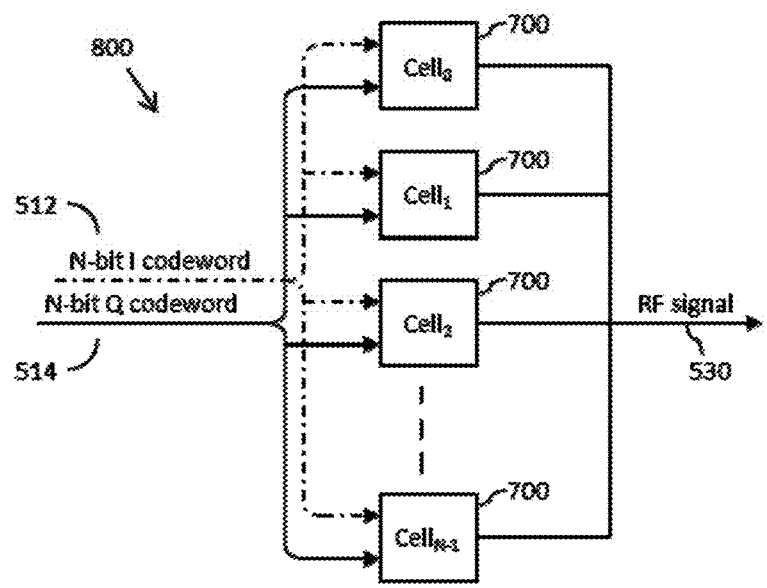
FIG. 8 illustrates a simplified block diagram of an example of an array of the power amplifier cells.

FIG. 8 illustrates a simplified block diagram of an example of an array 800 of the power amplifier cells 700 of FIG. 7. The array 800 comprises N power amplifier cells 700, and is arranged to receive an N-bit in-phase control word 512 and an N-bit quadrature control word 514. The power amplifier cells 700 generate an output signals in response to their respective bits within the N-bit in-phase control word 512 and the N-bit quadrature control word 514. The output signals 726 of the power amplifier cells 700 are then combined to form the analogue RF signal 530 for transmission over an RF interface, for example via the antenna 102 of FIG. 1. Advantageously, the power amplifier cells 700 are shared between the N-bit in-phase control word 512 and the N-bit quadrature control word 514, thereby enabling a single array 800 of N power amplifier cells 700 to be implemented in place of the two separate in-phase and quadrature arrays of power cells 510, 520 required in the digital power amplifier topology illustrated in FIG. 5. As a result, a significant reduction in the required silicon area to implement the power amplifier may be achieved.

Figure 9:
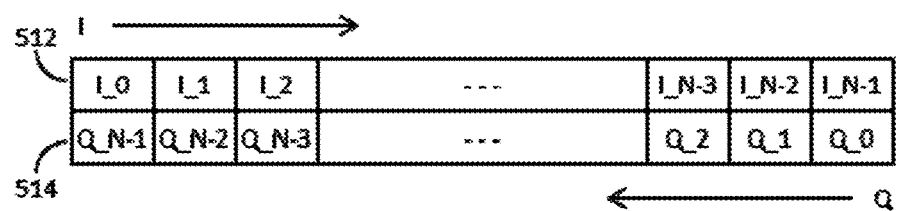
FIG. 9 illustrates an example of a complimentary control word collaboration scheme.

For the array 800 of power amplifier cells 700 illustrated in FIG. 8, since each of the power amplifier cells 700 is shared between the N-bit in-phase control word 512 and the N-bit quadrature control word 514, the cell turn-on sequences for the N-bit in-phase control word 512 and the N-bit quadrature control word 514 are no longer independent. FIG. 9 illustrates an example of a complimentary control word collaboration scheme. In the example illustrated in FIG. 9, each bit within the in-phase control word 512 is paired with its complementary bit within the quadrature control word 514. For example, bit '0' within the in-phase control word 512 is paired within bit 'N−1' within the quadrature control word 514, bit '1' within the in-phase control word 512 is paired within bit 'N−2' within the quadrature control word 514, etc. Each power amplifier cell 700 within the array 800 may thus be arranged to received paired control bits from the N-bit in-phase control word 512 and the N-bit quadrature control word 514 in accordance with the complimentary control word collaboration scheme illustrated in FIG. 9.

In this manner, the in-phase and quadrature control words 512, 514 may be arranged to turn-on the power amplifier cells 700 in an opposite order within the array 800 with respect to one another. For example, the in-phase control word 512 may be arranged to turn on the power amplifier cells 700 starting at a first 'end' of the array 800 and progressing in a first direction through the array 800, whilst the quadrature control word 514 may be arranged to turn on the power amplifier cells 700 starting at a second 'end' of the array 800 and progressing in a second (opposite) direction through the array 800.

Accordingly, when the control words 512, 514 are arranged to only turn on a small number of power amplifier cells 700 (i.e. a combined number of N), there will be no overlap and the interaction between the in-phase and quadrature control words 512, 514 will be similar to the conventional digital power amplifier topology illustrated in FIG. 5. However, when overlap occurs between the control words 512, 514, the interaction between the control words will be different to that of the conventional digital power amplifier topology illustrated in FIG. 5, due to one or more of the power amplifier cells being shared.

Figure 10:
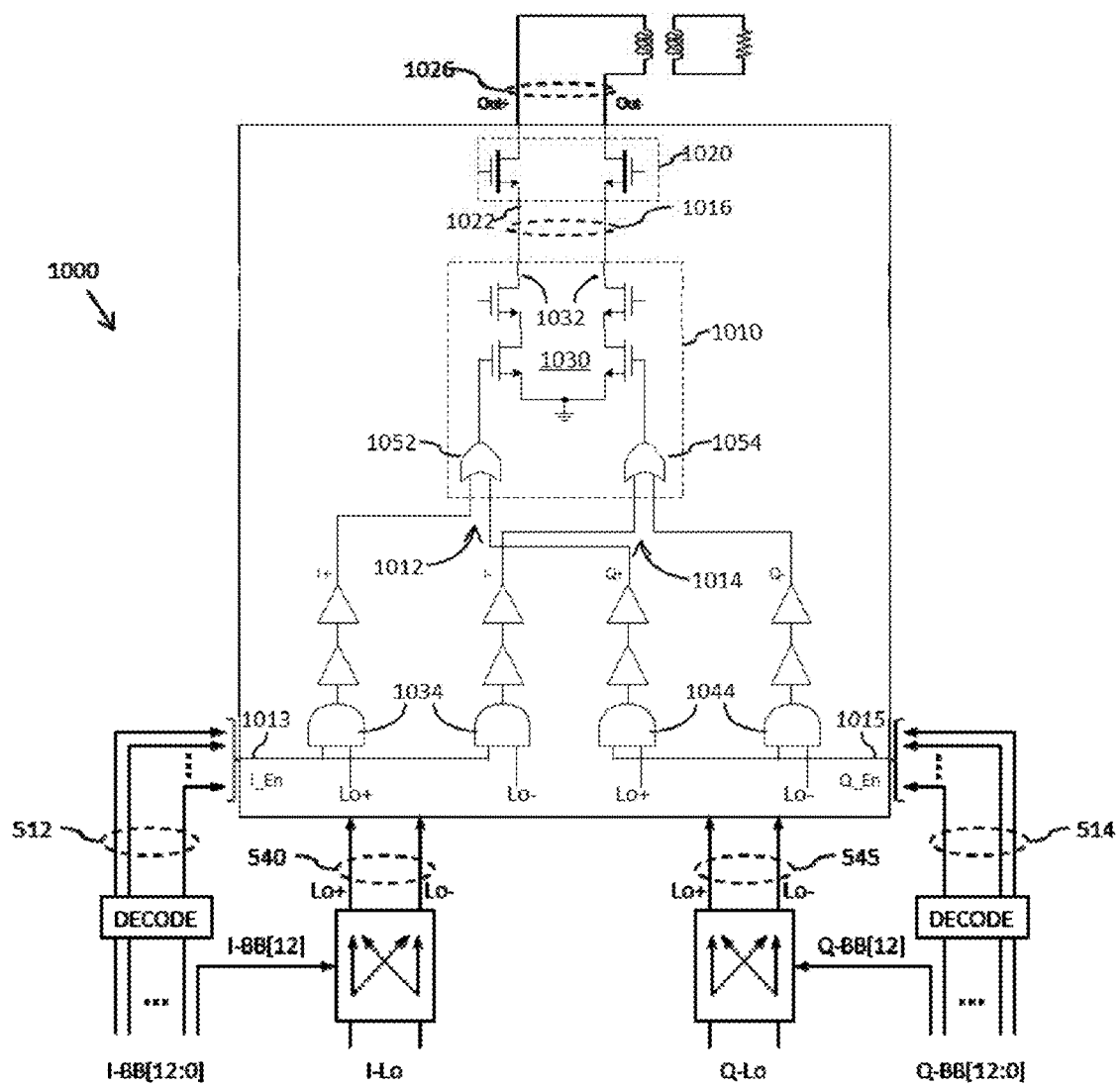
FIG. 10 illustrates a simplified circuit diagram of an example of an alternative power amplifier cell.

Referring now to FIG. 10, there is illustrated a simplified circuit diagram of an example of a further alternative power amplifier cell 1000, such as may also be implemented within the power amplifier module 230 as an alternative to the power cell 570 illustrated in FIG. 5. In a similar manner to the power amplifier cell 700 of FIG. 7, the power amplifier cell 1000 illustrated in FIG. 10 comprises an input stage 1010 comprising a first input 1012 arranged to receive an in-phase control signal, for example representative of a respective control bit 1013 within the in-phase magnitude control word 512. The input stage 1010 further comprises a second input 1014 arranged to receive a quadrature control signal, for example representative of a respective control bit 1015 within the quadrature magnitude control word 514. The input stage 1010 of the power amplifier cell 1000 is arranged to output a drive signal 1016 based on the received in-phase and quadrature control signals. The power amplifier cell 1000 further comprises an output stage 1020 arranged to receive at an input 1022 thereof the drive signal 1016 output by the input stage 1010, and to generate an output signal 1026 for the power amplifier cell 1000 in response to the received drive signal 1016.

An in-phase input of the power amplifier cell 1000 comprises (for each differential signal path) an AND gate 1034 arranged to receive the respective bit 1013 of the in-phase control word 512 and respective differential components of the in-phase carrier frequency signal 540, and to output a modulated representation of the logical state of the respective bit 1013 of the in-phase control word 512. Similarly, a quadrature input of the power amplifier cell 1000 comprises (for each differential signal path) an AND gate 1044 arranged to receive the respective bit 1015 of the quadrature control word 514 and respective differential components of the quadrature carrier frequency signal 545, and to output a modulated representation of the logical state of the respective bit 1015 of the quadrature control word 514.

In the example illustrated in FIG. 10, the input stage 1010 comprises a pair of OR gates 1052, 1054, the first OR gate 1052 being arranged to receive at inputs thereof a first differential component (e.g. a positive differential component) of each of the differential representations of the logical states of the respective bits 1013, 1015 of the control words 512, 514, and the second OR gate 1054 being arranged to receive at inputs thereof a second differential component (e.g. a negative differential component) of each of the differential representations of the logical states of the respective bits 1013, 1015 of the control words 512, 514. The input stage 1010 further comprises a single, shared common-source amplifier transistor structure 1030 comprising gate input nodes operably coupled to the outputs of the OR gates 1052, 1054. In this manner, the shared common-source amplifier structure 1030 is arranged to output a drive current if either of the respective bits 1013, 1015 of the control words 512, 514 comprises a high logical state (e.g. a '1').

Advantageously, for the example illustrated in FIG. 10 the two input sub-stages 730, 740 of the example of FIG. 7 are replaced by a single, shared common source amplifier transistor structure 1030. In this manner, the silicon area requirement for the power amplifier cell 1000 may be further reduced. It will be appreciated that whilst the examples illustrated in FIGS. 7 and 10 relate to differential power amplifier cells, the present invention may equally be implemented within singular (i.e. non-differential) signal power amplifier cells.

In the example illustrated in FIG. 7, only the output stage 720 is shared and is able to 'sum' separate I and Q input stage current signals to some degree. However, in the full sharing topology illustrated in FIG. 10, both the input stage 1010 and the output stage 1020 of the power amplifier cell 1000 are shared. As a result the power amplifier cell is either on or off, so there is no difference in the output current if either one or both I and Q signals attempt to turn the cell on. As a result, I/Q overlap should be prevented if possible within the full sharing topology illustrated in FIG. 10, for example through code word 'clipping'.

Figure 11:
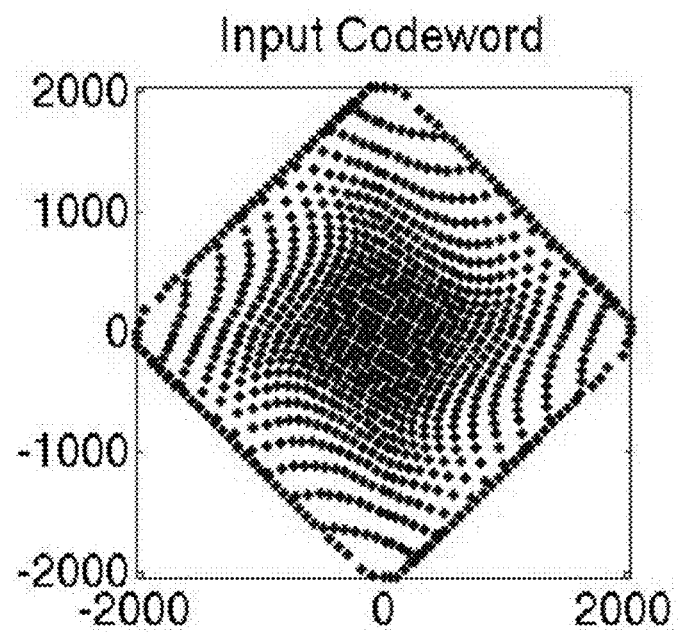
FIG. 11 illustrates an example of a clipped 2D codeword profile.
Figure 12:
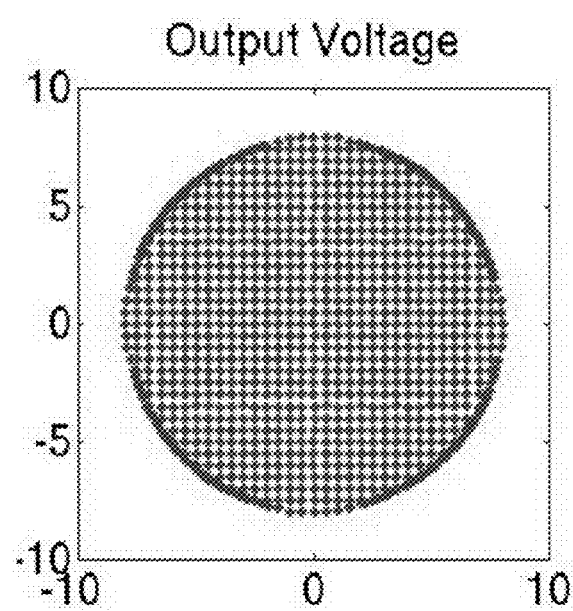
FIG. 12 illustrates an example of the output voltage profile for a clipped 2D codeword profile.

FIG. 11 illustrates an example of a 'clipped' 2D codeword profile, whereby I/Q overlap is avoided for the complimentary control word collaboration scheme illustrated in FIG. 9. Significantly, with the PA nonlinearity, the output voltage profile of the power amplifier still remains a circular shape, as illustrated in FIG. 12, which means no loss of output range.

Figure 13:
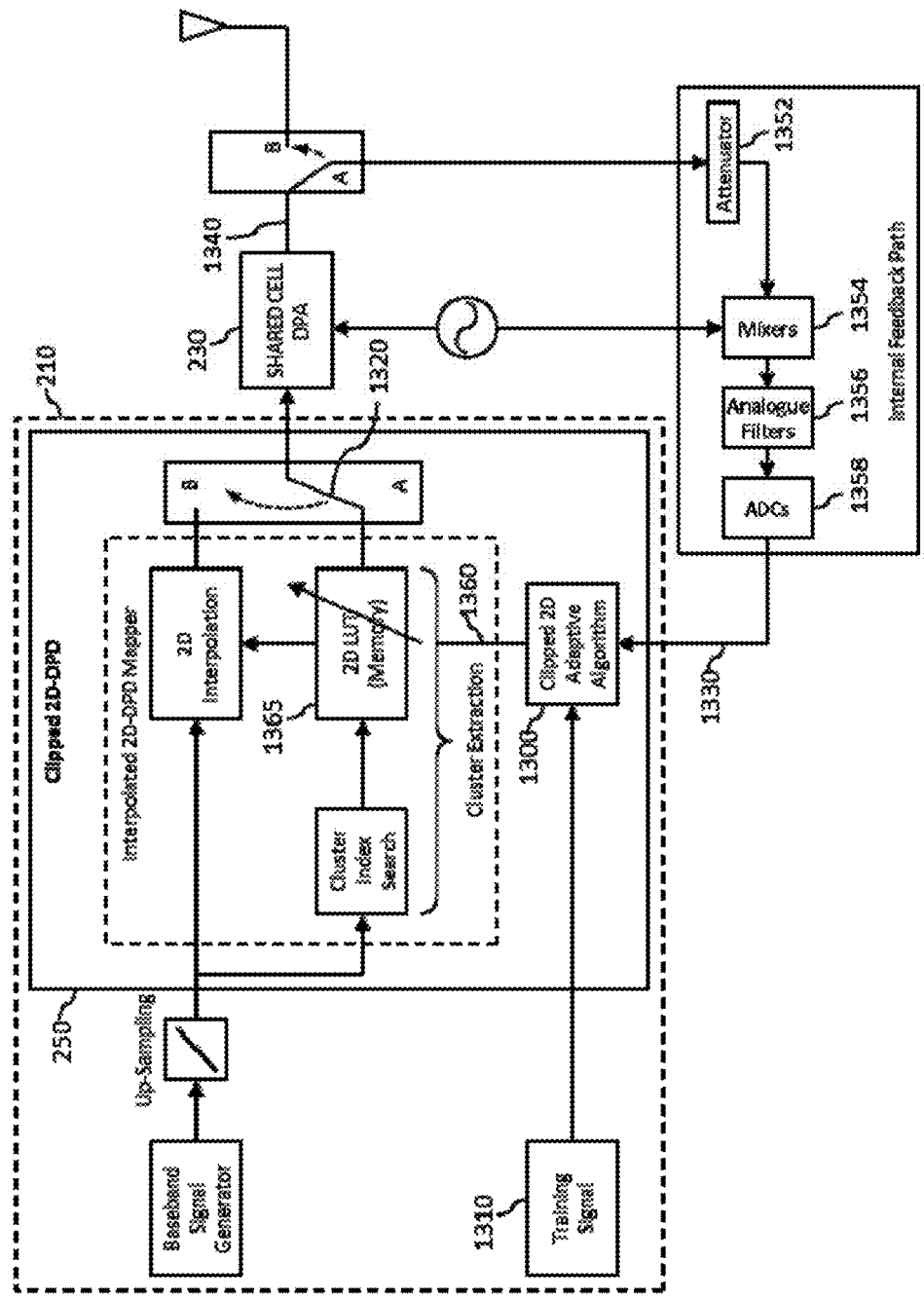
FIG. 13 illustrates a simplified block diagram of an example of a pre-distortion calibration implementation.

In some example embodiments, clipping may occur before the codewords are fed to the digital power amplifier, for example during calibration of the digital pre-distortion. FIG. 13 illustrates a simplified block diagram of an example of a pre-distortion calibration implementation in which a two dimensional codeword profile is clipped to prevent I/Q overlap, such as may be implemented within the radio frequency transmitter architecture of FIG. 2. In the illustrated example, the digital pre-distortion component 250, which in the illustrated example is implemented within the digital signal processing module 210, comprises an adaptive algorithm component 1300. The adaptive algorithm component 1300 is arranged, when the radio frequency transmitter architecture is configured to operate in a training/calibration mode, to perform calibration of the digital pre-distortion component 250, and in particular for the example illustrated in FIG. 13 to perform clipped calibration of the digital pre-distortion component 250.

For example, and as illustrated in FIG. 13, when the radio frequency transmitter architecture is configured to operate in a transmission mode ('A'), the digital pre-distortion component 250 is arranged to receive the two dimensional (i.e. I/Q) up-sampled input signals 242, 244 (FIG. 2), perform pre-distortion of the received input signal and to output a two dimensional digital control value comprising the digital control words 212, 214 to the digital power amplifier module 230. However, when the radio frequency transmitter architecture is arranged to operate in a training/calibration mode ('B'), the digital pre-distortion component 250 is arranged to receive a digital reference signal comprising a training signal 1310, and to output to the digital power amplifier module 230 a digital power amplifier control value 1320 representative of the received digital training input signal 1310. The digital pre-distortion component 250 is further arranged to receive a feedback signal 1330 from an output 1340 of the digital power amplifier module 230, and to perform calibration thereof based at least partly on the received feedback signal 1330. The digital pre-distortion component 250 may be dynamically configurable, for example via software, to switch between operating in the transmission mode 'A' and the training/calibration mode 'B'.

When the digital pre-distortion component 250 is operating in the training/calibration mode 'B', the adaptive algorithm 1300 of the digital pre-distortion component 250 is arranged to receive the training signal 1300, and to output 1360 to, in the illustrated example, a two dimensional lookup table (LUT) 1365 a data point from a set of digital power amplifier profile data points representative of the training signal 1310, and to which a digital power amplifier control value has been mapped within the two dimensional LUT 1354. Upon receipt of the data point output 1360 by the adaptive algorithm 1300, the two dimensional LUT 1354 outputs the respective digital power amplifier control value 1320 to the digital power amplifier module 230.

In the illustrated example, the feedback signal 1330 is provided via a feedback path comprising an internal attenuator 1352 arranged to receive and perform attenuation of the signal output 1340 by the digital power amplifier module 230 to ensure that the mixers are not over-driven. Mixers 1354 receive the attenuated feedback signal from the attenuator 1352 and mix it with carrier frequency signals provided to the digital power amplifier module 230 to step down the attenuated feedback signal from a transmitted RF frequency to the baseband frequency. The feedback signal is then filtered by analogue filters 1356 before analogue to digital converters (ADCs) 1358 convert the analogue feedback signal into the digital feedback signal 1330 received by the digital pre-distortion component 250. In this manner, the digital feedback signal 1330 provided to the digital pre-distortion component 250 may comprise a format corresponding to that of the digital training signal 1310.

Upon receipt of the digital feedback signal 1330, the adaptive algorithm 1300 performs calibration of the digital pre-distortion component 250 by updating the digital power amplifier value mapped to the digital training signal within the two dimensional LUT 1365, for example in an iterative process such that a value of the received feedback signal 1330 substantially converges with the data point value of the training signal (a known reference signal) 1310. For example, the adaptive algorithm 1300 may be arranged to perform a comparison of the digital training signal (a known reference signal) 1310 and the feedback signal 1330, and to update the respective digital power amplifier control value mapped to the training signal data point value within the two dimensional LUT 1360 based on said comparison. A more detailed explanation of an example of such calibration is described within the Applicant's co-pending patent application US20120269293, which is incorporated in its entirety herein by reference.

In particular, in the example illustrated in FIG. 13 the adaptive algorithm 1300 comprises a clipped two dimensional adaptive algorithm arranged to perform calibration of the digital pre-distortion component 250 by updating the digital power amplifier control values such that they are constrained to only 'clipped' values in order to avoid any I/Q overlap, for example in accordance with a complimentary control word collaboration scheme as illustrated in FIG. 9.

Figure 14:
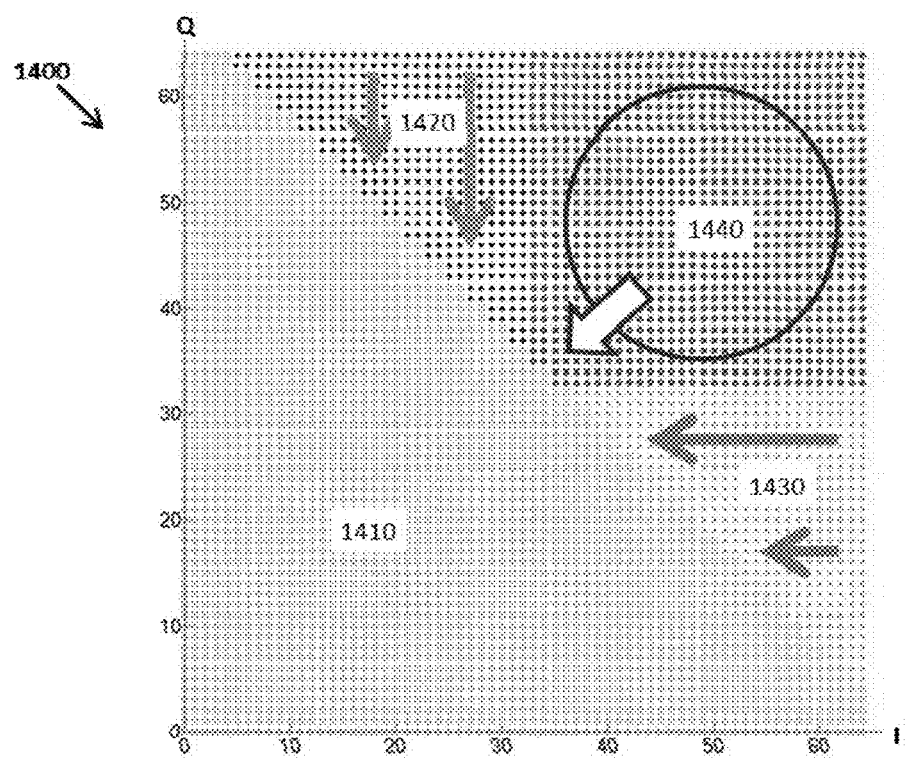
FIG. 14 illustrates examples of how clipping of a dimensional control word values may be implemented.

FIG. 14 illustrates examples of how such clipping of the two dimensional control word values may be implemented. The area illustrated in FIG. 14 represents one quadrant 1400 of the two dimensional digital power amplifier control word profile, in which the possible I and Q codewords are all positive. The lower left triangular portion 1410 represents the allowed codeword area, in which no I/Q overlap will occur for the complimentary control word collaboration scheme as illustrated in FIG. 9. The remaining part of the quadrant 1400 is prohibited. Each codeword in the prohibited part of the quadrant 1400 may be mapped to a unique codeword within the allowed codeword area 1410. For example, codewords within the area indicated at 1420 may be mapped in a 'vertical' direction, i.e. maintaining their I codeword values, but having their Q codeword values mapped to the first allowed Q codeword value. Similarly, codewords within the area indicated at 1430 may be mapped in a 'horizontal' direction, i.e. maintaining their Q codeword values, but having their I codeword values mapped to the first allowed I codeword value. The codewords within the area indicated at 1440 may all be mapped to a single allowed codeword, such as indicated by the arrow.

Such codeword clipping as illustrated in FIG. 14, when applied to all four quadrants of the digital power amplifier control word profile, would result in a diamond shaped clipping Scheme. It will be appreciated that such a scheme is only one example of a suitable clipping scheme, and it is contemplated that any suitable alternative scheme may be implemented. Other examples of clipping schemes may comprise, say, circular clipping schemes, polygone (e.g. octagon) clipping schemes, etc. In other examples, a more general clipping algorithm may be implemented, whereby codewords for which I+Q is less than or equal to a threshold value (e.g. the total number of cells) may remain unclipped, whilst codewords for which I+Q exceeds this threshold value are clipped.

Advantageously, such clipping during calibration reduces the number of permissible codewords. As such, the calibration process is simplified/reduced.

Figure 15:
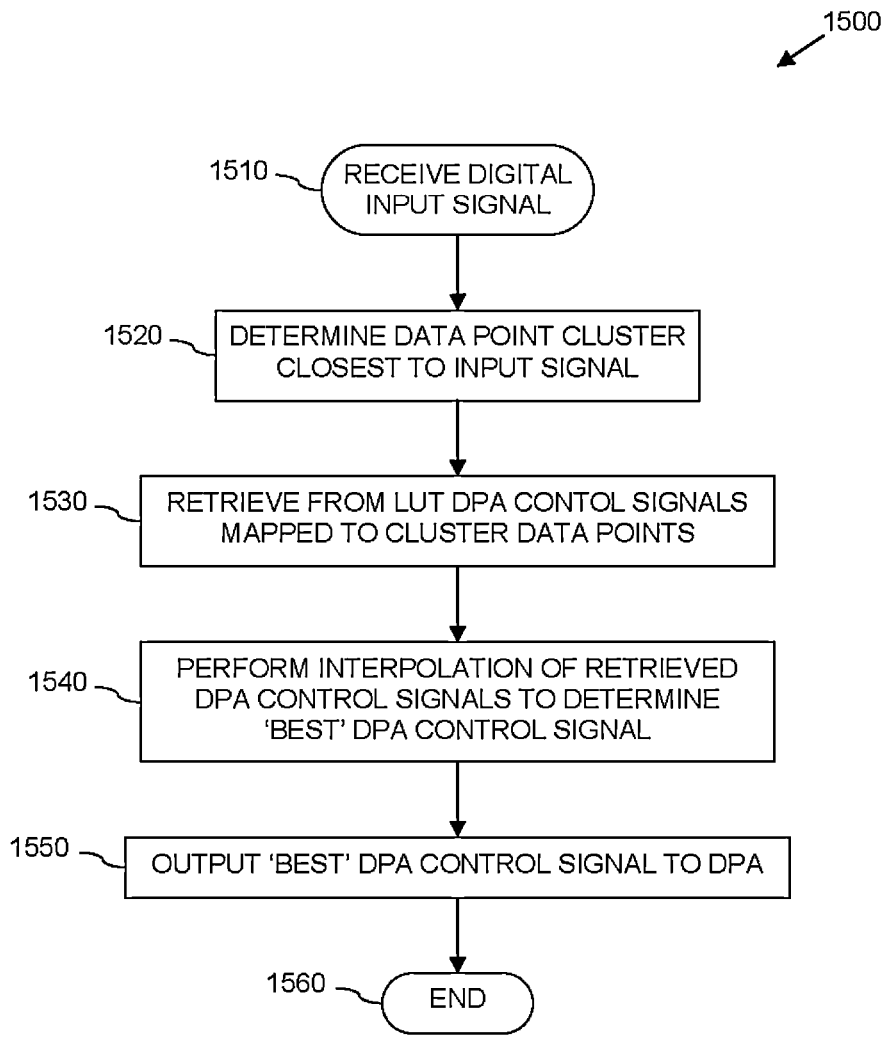
FIGS. 15 and 16, illustrate simplified flowcharts of parts of a method of performing digital pre-distortion of a signal for transmission over an RF interface.
Figure 16:
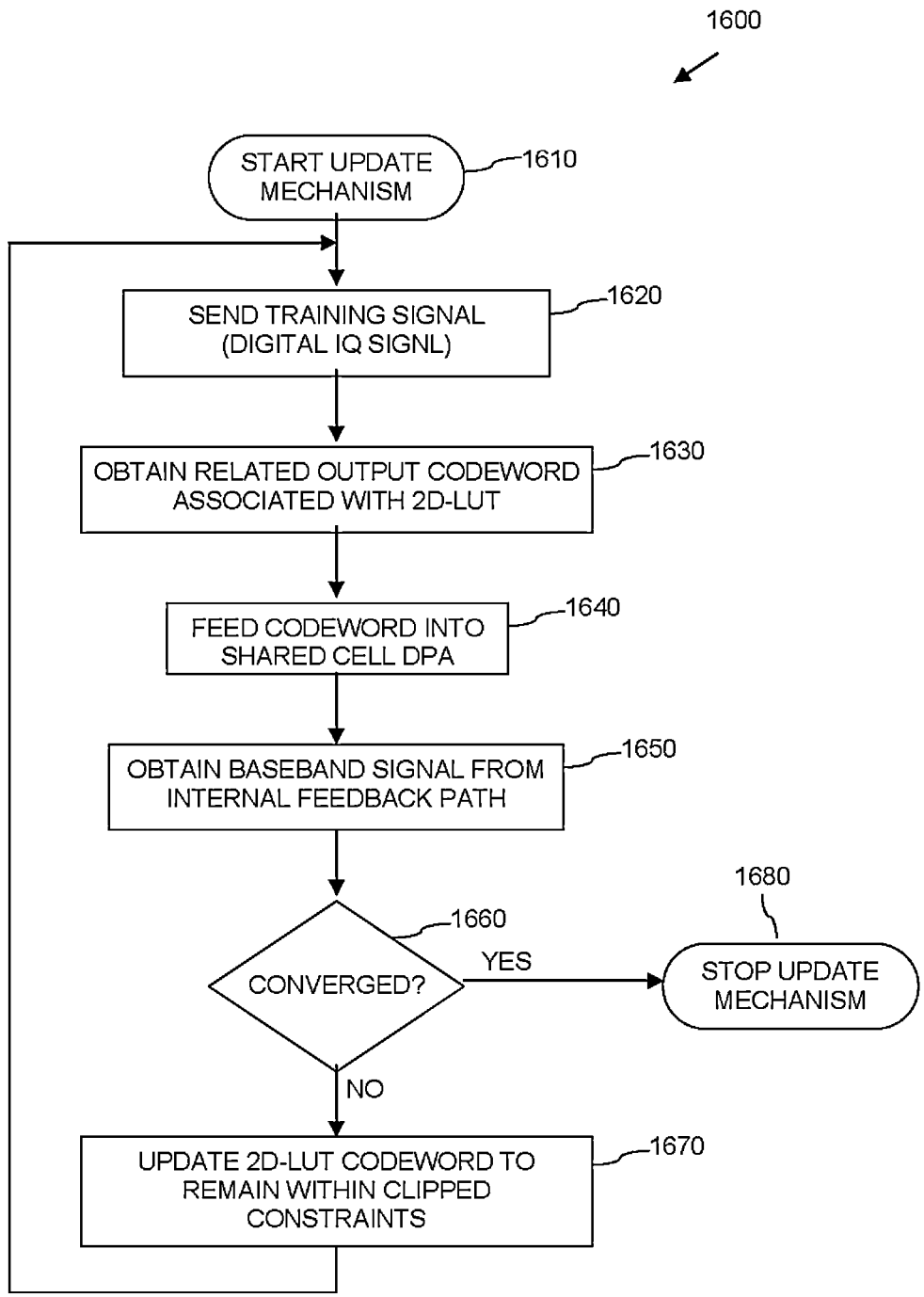

Referring now to FIGS. 15 and 16, there are illustrated simplified flowcharts 1500 and 1600 of parts of a method of performing digital pre-distortion of a signal for transmission over an RF interface. A first part of the method, during a first, transmission mode of operation, starts at 1510 with the receipt of a digital input signal, such as the up-sampled digital signals 242, 244 illustrated in FIGS. 2 to 4. Next, at 1520, a cluster of data points closest to the input signal from within a digital power amplifier profile are determined. Digital power amplifier control values, from a first set of digital power amplifier control values, mapped to the determined cluster of data points are then retrieved from a LUT, at 1530. In this manner, a plurality of digital power amplifier control values are selected from a first set of digital power amplifier control values, based at least partly on the received digital input signal. Interpolation of the plurality of selected digital power amplifier control values is then performed at 1540 to determine a digital power amplifier control value from a second set of digital power amplifier control values representative of the received digital input signal. In some examples, the second set of digital power amplifier control values comprises a clipped set of control values in order to avoid any I/Q overlap, for example in accordance with a complimentary control word collaboration scheme as illustrated in FIG. 9. The determine a digital power amplifier control value from the second set of digital power amplifier control values representative of the received digital input signal is then output, at 1550, to a digital power amplifier module. The first part of the method then ends at 1560.

A second part of the method, during a second, training mode of operation, starts at 1610 with the starting of an update mechanism for each point in a two dimensional LUT. Next, at 1620, the method moves onto 1620, where a training signal comprising in the illustrated example a digital IQ signal is provided. A corresponding digital power amplifier control word mapped to the received training signal value within the LUT is then retrieved, at 1630, and output to the digital power amplifier module, at 1640. A feedback signal for the retrieved digital power amplifier control word is then obtained from an output of the digital power amplifier module, at 1650. It is then determined, at 1660, whether the training signal with a linear gain G and the feedback signal for the retrieved DPA control word mapped thereto are substantially equal (i.e. have converged). If not, the method moves on to 1670, where the digital power amplifier control value mapped to the value of the training signal is updated in order to make the feedback signal equal to the value of the training signal with a linear gain G. Specifically in the illustrated example, the digital power amplifier control value is updated such that it remains within clipped constraints to avoid in-phase and quadrature overlap in accordance with a complimentary control word collaboration scheme. The method then loops back to 1640. Referring back to 1660, if the training signal with a linear gain G and the feedback signal for the retrieved DPA control word mapped thereto are substantially equal, the method moves on to 1680, where the update mechanism is stopped.

Figure 17:
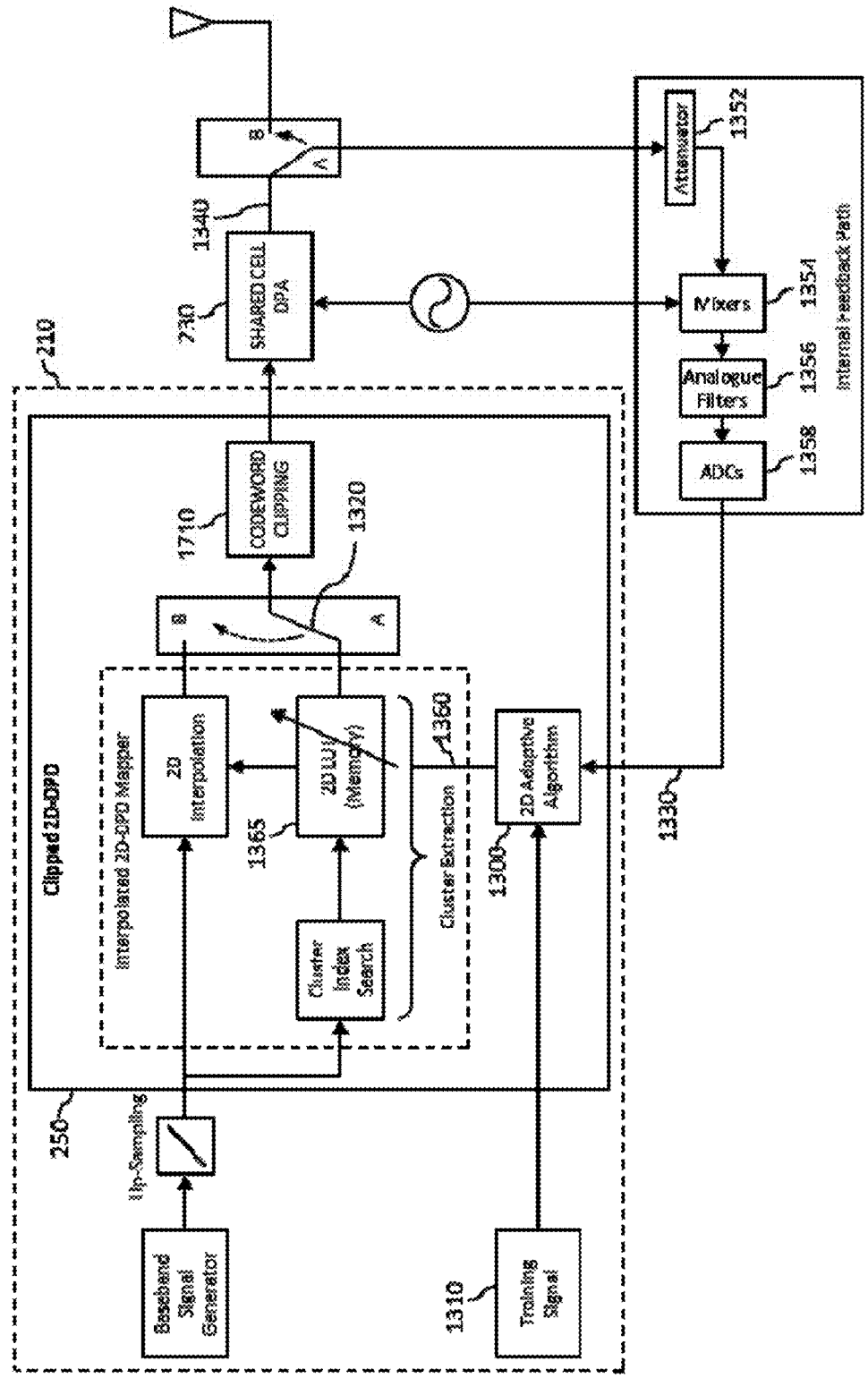
FIG. 17 illustrates a simplified block diagram of an alternative example of a pre-distortion calibration implementation.

Referring Now to FIG. 17, there is illustrated a simplified block diagram of an alternative example of a pre-distortion calibration implementation in which a two dimensional codeword profile is clipped to prevent I/Q overlap, such alternatively be implemented within the radio frequency transmitter architecture of FIG. 2. In the example illustrated in FIG. 17, the codeword clipping is performed after the digital pre-distortion is performed, at 1710.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A power amplifier module comprising an array of power amplifier cells, wherein each power amplifier cell comprises:
   a first input arranged to receive an in-phase control signal;
   a second input arranged to receive a quadrature control signal;
   an input stage arranged to output a drive signal based at least partly on the received in-phase and quadrature control signals;
   an output stage arranged to receive at an input thereof the drive signal output by the input stage, and to generate an output signal for the power amplifier cell in response to the received drive signal;
   wherein each bit within an N-bit in-phase control word is paired with a complementary bit within an N-bit quadrature control word such that bit T within the N-bit in-phase control word is paired with bit 'N−1−i' within the N-bit quadrature control word, and each power amplifier cell is controlled by a pair of complementary bits from the in-phase control word and the quadrature control word; and
   the in-phase control signal for each power amplifier cell is obtained according to an in-phase carrier frequency signal and the in-phase bit of the respective pair of complementary bits, and the quadrature control signal for each power amplifier cell is obtained according to a quadrature carrier frequency signal and the quadrature bit of the respective pair of complementary bits.

2. A communication unit comprising a power amplifier module according to claim 1.

3. A radio frequency transmitter architecture comprising at least one digital signal processing module configurable to operate in a transmission mode in which the at least one digital signal processing module is arranged to:
   receive a digital input signal;
   select, from a clipped set of digital power amplifier control words, a digital power amplifier control word based at least partly on the received digital input signal;
   output to at least one power amplifier module according to claim 1 the selected clipped digital power amplifier control word.

4. The radio frequency transmitter architecture of claim 3, wherein the clipped set of digital power amplifier control words are clipped to avoid in-phase and quadrature overlap in accordance with a complimentary control word collaboration scheme.

5. The radio frequency transmitter architecture of claim 4, wherein the clipped set of digital power amplifier control words are clipped by mapping prohibited codewords to at least one allowed codeword.

6. The radio frequency transmitter architecture of claim 3, wherein the at least one digital signal processing module is configurable to operate in a training/calibration mode in which the at least one digital signal processing module is arranged to:
receive a digital training signal;
output to the at least one power amplifier module a digital power amplifier control word representative of the received digital training signal;
receive a feedback signal from an output of the at least one digital power amplifier module; and
perform calibration of the clipped set of digital power amplifier control value words such that the digital power amplifier control words remain within clipped constraints to avoid in-phase and quadrature overlap in accordance with a complimentary control word collaboration scheme.

7. The power amplifier module of claim 1, wherein one of the pair of the pair of complementary bits is 0, and the other of the pair of complementary bits is 1.

8. The power amplifier module of claim 1, wherein the input stage comprises at least one OR gate arranged to receive at a first input thereof the in-phase control signal and at a second input thereof the quadrature control signal, and the input stage is arranged to output the drive signal in response to a logical state output by the OR gate.

9. The power amplifier module of claim 1, wherein the input stage comprises a first OR gate and a second OR gate, wherein the first OR gate is arranged to receive at a first input thereof a first differential component of the in-phase control signal and at a second input thereof a first differential component of the quadrature control signal; wherein the second OR gate is arranged to receive at a first input thereof a second differential component of the in-phase control signal and at a second input thereof a second differential component of the quadrature control signal.

10. The power amplifier module of claim 1, wherein the input stage and the output stage comprise a cascode transistor topology.

11. The power amplifier module of claim 1, wherein the input stage comprises a double cascode structure.

12. The power amplifier module of claim 1, wherein:
the input stage is arranged to output a differential drive signal based at least partly on the in-phase and quadrature control signals;
the output stage is arranged to receive at a differential input thereof the differential drive signal output by the input stage, and to generate a differential output signal for the power amplifier cell in response to the received differential drive signal.

13. A method of performing digital pre-distortion calibration within a radio frequency architecture, the method comprising:
receiving a digital training signal;
outputting to at least one power amplifier module a digital power amplifier control value representative of the received digital training signal;
receiving a feedback signal from an output of the at least one digital power amplifier module; and
performing calibration of a clipped set of digital power amplifier control was values such that the digital power amplifier control values remain within clipped constraints to avoid in-phase (I) and quadrature (Q) overlap in accordance with a complimentary control word collaboration scheme,
wherein the clipped set of digital power amplifier control values are clipped by mapping prohibited codewords for which I+Q exceeds a threshold value to at least one allowed codeword.

14. The method of performing digital pre-distortion calibration within a radio frequency architecture of claim 13, further comprising receiving a digital input signal; selecting, from the clipped set of digital power amplifier control values, a digital power amplifier control value based at least partly on the received digital input signal; and outputting to the at least one power amplifier module the selected clipped digital power amplifier control value.

15. The method of performing digital pre-distortion calibration within a radio frequency architecture of claim 14, wherein the threshold value is a number of cells in the at least one power amplifier module.

16. The method of performing digital pre-distortion calibration within a radio frequency architecture of claim 13, wherein the threshold value is a number of cells in the at least one power amplifier module.

* * * * *